US011353857B2

(12) United States Patent
Igarashi et al.

(10) Patent No.: US 11,353,857 B2
(45) Date of Patent: Jun. 7, 2022

(54) DATA ANALYZER, SEMICONDUCTOR MANUFACTURING SYSTEM, DATA ANALYSIS METHOD, AND SEMICONDUCTOR MANUFACTURING METHOD

(71) Applicant: Gigaphoton Inc., Tochigi (JP)

(72) Inventors: Yutaka Igarashi, Oyama (JP); Yuji Minegishi, Oyama (JP); Osamu Wakabayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 280 days.

(21) Appl. No.: 16/729,990

(22) Filed: Dec. 30, 2019

(65) Prior Publication Data

US 2020/0133249 A1   Apr. 30, 2020

Related U.S. Application Data

(63) Continuation of application No. PCT/JP2017/030907, filed on Aug. 29, 2017.

(51) Int. Cl.
*G05B 19/418* (2006.01)
*G03F 7/20* (2006.01)

(52) U.S. Cl.
CPC ... *G05B 19/41875* (2013.01); *G03F 7/70508* (2013.01); *G05B 2219/31308* (2013.01); *G05B 2219/45031* (2013.01)

(58) Field of Classification Search
CPC ........ G03F 7/20; G03F 7/705; G03F 7/70508; G03F 7/70525; G05B 19/41875;
(Continued)

(56) References Cited

U.S. PATENT DOCUMENTS

2002/0088952 A1* 7/2002 Rao ..................... G01N 21/9501
250/559.45
2004/0181299 A1   9/2004 Yamazaki et al.
(Continued)

FOREIGN PATENT DOCUMENTS

CN         105452963 A    3/2016
JP         2004281461 A   10/2004
(Continued)

OTHER PUBLICATIONS

An Office Action mailed by the Japanese Patent Office dated Apr. 6, 2021, which corresponds to Japanese Patent Application No. 2019-538784 and is related to U.S. Appl. No. 16/729,990; with English language translation.
(Continued)

*Primary Examiner* — Yuhui R Pan
(74) *Attorney, Agent, or Firm* — Studebaker & Brackett PC

(57) ABSTRACT

A data analyzer includes a data collector that acquires data on each analysis target parameter of each of a plurality of apparatuses from the apparatus, the plurality of apparatuses including a light source apparatus, an exposure apparatus that exposes a wafer to pulsed light outputted from the light source apparatus, and a wafer inspection apparatus that inspects the exposed wafer, an image generator that visualizes the data on each of the parameters collected by the data collector from the apparatuses that process the wafer for each predetermined area of the wafer to convert the data into an image and generates a plurality of mapped images for each of the parameters of the apparatuses, and a correlation computing section that performs pattern matching on arbitrary ones of the mapped images generated from the wafer to determine a correlation value between arbitrary ones of the parameters of the apparatuses.

18 Claims, 27 Drawing Sheets

(58) Field of Classification Search
CPC ........... G05B 2219/31308; G05B 2219/45031; H01L 21/027; Y02P 90/02
See application file for complete search history.

(56) References Cited

U.S. PATENT DOCUMENTS

| | | | |
|---|---|---|---|
| 2006/0192936 | A1 | 8/2006 | Schenau et al. |
| 2013/0124141 | A1 | 5/2013 | Brill et al. |
| 2015/0168848 | A1 | 6/2015 | Tanaka et al. |
| 2015/0227654 | A1* | 8/2015 | Hunsche ................. G06F 30/20 716/54 |
| 2016/0154319 | A1 | 6/2016 | Mossavat et al. |
| 2017/0132352 | A1* | 5/2017 | Cantwell ............. G03F 7/70625 |
| 2018/0196347 | A1 | 7/2018 | Minegishi et al. |

FOREIGN PATENT DOCUMENTS

| | | |
|---|---|---|
| JP | 2006203123 A | 8/2006 |
| JP | 2006-237626 A | 9/2006 |
| JP | 2006237052 A | 9/2006 |
| JP | 2013174575 A | 9/2013 |
| JP | 2017505460 A | 2/2017 |
| WO | 2014030645 A1 | 2/2014 |
| WO | 2017068619 A1 | 4/2017 |

OTHER PUBLICATIONS

International Search Report issued in PCT/JP2017/030907; dated Nov. 28, 2017.
International Preliminary Report on Patentability and Written Opinion issued in PCT/JP2017/030907; dated Mar. 3, 2020.
An Office Action mailed by China National Intellectual Property Administration dated Mar. 25, 2022, which corresponds to Chinese Patent Application No. 201780092708.6 and is related to U.S. Appl. No. 16/729,990; with English language translation.

* cited by examiner

FIG. 5A

| Wafer NUMBER | Scan NUMBER | Pulse NUMBER | Time | BEAM MEASUREMENT RELATED DATA Db ||||| ENERGY CONTROL RELATED DATA Deg |||
|---|---|---|---|---|---|---|---|---|---|---|
| | | | | BEAM WIDTH Bwh IN DIRECTION H | BEAM WIDTH Bwv IN DIRECTION V | BEAM POSITION Bch IN DIRECTION H | BEAM POSITION Bcv IN DIRECTION V | TARGET PULSE ENERGY Et | PULSE ENERGY E | CHARGING VOLTAGE V |
| #1 | #1 | #1 | Time(1,1,1) | Bwh(1,1,1) | Bwv(1,1,1) | Bch(1,1,1) | Bcv(1,1,1) | Et(1,1,1) | E(1,1,1) | V(1,1,1) |
| #1 | #1 | #2 | Time(1,1,2) | Bwh(1,1,2) | Bwv(1,1,2) | Bch(1,1,2) | Bcv(1,1,2) | Et(1,1,2) | E(1,1,2) | V(1,1,2) |
| #1 | #1 | #3 | Time(1,1,3) | Bwh(1,1,3) | Bwv(1,1,3) | Bch(1,1,3) | Bcv(1,1,3) | Et(1,1,3) | E(1,1,3) | V(1,1,3) |
| ... | ... | ... | ... | ... | ... | ... | ... | ... | ... | ... |
| #1 | #2 | #1 | Time(1,2,1) | Bwh(1,2,1) | Bwv(1,2,1) | Bch(1,2,1) | Bcv(1,2,1) | Et(1,2,1) | E(1,2,1) | V(1,2,1) |
| #1 | #2 | #2 | Time(1,2,2) | Bwh(1,2,2) | Bwv(1,2,2) | Bch(1,2,2) | Bcv(1,2,2) | Et(1,2,2) | E(1,2,2) | V(1,2,2) |
| #1 | #2 | #3 | Time(1,2,3) | Bwh(1,2,3) | Bwv(1,2,3) | Bch(1,2,3) | Bcv(1,2,3) | Et(1,2,3) | E(1,2,3) | V(1,2,3) |
| #1 | #3 | | | | | | | | | |
| ... | ... | ... | ... | ... | ... | ... | ... | ... | ... | ... |
| #w | #s | #p | Time(w,s,p) | Bwh(w,s,p) | Bwv(w,s,p) | Bch(w,s,p) | Bcv(w,s,p) | Et(w,s,p) | E(w,s,p) | V(w,s,p) |
| ... | ... | ... | ... | ... | ... | ... | ... | ... | ... | ... |

FIG. 5B

| Wafer NUMBER | Scan NUMBER | Pulse NUMBER | Time | SPECTRUM CONTROL RELATED DATA D$\lambda$c | | | | GAS CONTROL RELATED DATA Dgs |
|---|---|---|---|---|---|---|---|---|
| | | | | TARGET WAVELENGTH $\lambda t$ | WAVELENGTH $\lambda$ | TARGET SPECTRAL LINEWIDTH $\Delta\lambda t$ | SPECTRAL LINEWIDTH $\Delta\lambda$ | GAS PRESSURE $p$ |
| #1 | #1 | #1 | Time (1,1,1) | $\lambda t$ (1,1,1) | $\lambda$ (1,1,1) | $\Delta\lambda t$ (1,1,1) | $\Delta\lambda$ (1,1,1) | $p$ (1,1,1) |
| #1 | #1 | #2 | Time (1,1,2) | $\lambda t$ (1,1,2) | $\lambda$ (1,1,2) | $\Delta\lambda t$ (1,1,2) | $\Delta\lambda$ (1,1,2) | $p$ (1,1,2) |
| #1 | #1 | #3 | Time (1,1,3) | $\lambda t$ (1,1,3) | $\lambda$ (1,1,3) | $\Delta\lambda t$ (1,1,3) | $\Delta\lambda$ (1,1,3) | $p$ (1,1,3) |
| #1 | #1 | · | · | · | · | · | · | · |
| #1 | #2 | #1 | Time (1,2,1) | $\lambda t$ (1,2,1) | $\lambda$ (1,2,1) | $\Delta\lambda t$ (1,2,1) | $\Delta\lambda$ (1,2,1) | $p$ (1,2,1) |
| #1 | #2 | #2 | Time (1,2,2) | $\lambda t$ (1,2,2) | $\lambda$ (1,2,2) | $\Delta\lambda t$ (1,2,2) | $\Delta\lambda$ (1,2,2) | $p$ (1,2,2) |
| #1 | #2 | #3 | Time (1,2,3) | $\lambda t$ (1,2,3) | $\lambda$ (1,2,3) | $\Delta\lambda t$ (1,2,3) | $\Delta\lambda$ (1,2,3) | $p$ (1,2,3) |
| #1 | #2 | · | | | | | | |
| #1 | #3 | · | | | | | | |
| · | · | · | | | | | | |
| #w | #s | #p | Time (w,s,p) | $\lambda t$ (w,s,p) | $\lambda$ (w,s,p) | $\Delta\lambda t$ (w,s,k) | $\Delta\lambda$ (w,s,k) | $p$ (w,s,k) |
| · | · | · | | | | | | |

FIG. 14
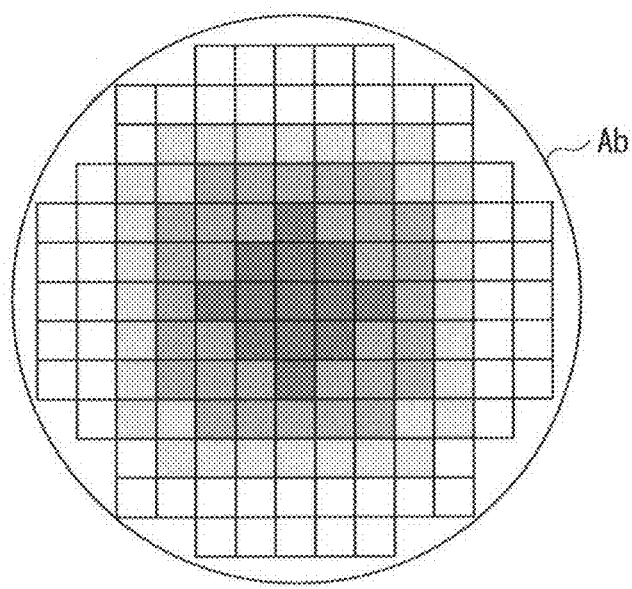
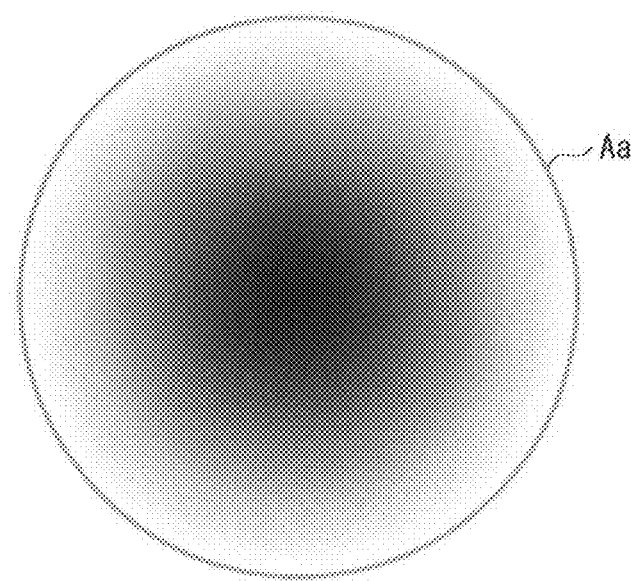

FIG. 19

| COMBINATION | IMAGE | IMAGE | CORRELATION COEFFICIENT | COMBINATION | IMAGE | IMAGE | CORRELATION COEFFICIENT |
|---|---|---|---|---|---|---|---|
| A AND B | $Aa_1$ | $Ba_1$ | $A_1B_1$ | B AND C | $Ba_1$ | $Ca_1$ | $B_1C_1$ |
|  | $Aa_1$ | $Ba_2$ | $A_1B_2$ |  | $Ba_1$ | $Ca_2$ | $B_1C_2$ |
|  | . | . | . |  | . | . | . |
|  | $Aa_1$ | $Ba_{nb}$ | $A_1B_{nb}$ |  | $Ba_1$ | $Ca_{nc}$ | $B_1C_{nc}$ |
|  | $Aa_2$ | $Ba_1$ | $A_2B_1$ |  | $Ba_2$ | $Ca_1$ | $B_2C_1$ |
|  | $Aa_2$ | $Ba_2$ | $A_2B_2$ |  | $Ba_2$ | $Ca_2$ | $B_2C_2$ |
|  | . | . | . |  | . | . | . |
|  | $Aa_2$ | $Ba_{nb}$ | $A_2B_{nb}$ |  | $Ba_2$ | $Ca_{nc}$ | $B_2C_{nc}$ |
|  | . | . | . |  | . | . | . |
|  | $Aa_{na}$ | $Ba_1$ | $A_{na}B_1$ |  | $Ba_{nb}$ | $Ca_1$ | $B_{nb}C_1$ |
|  | $Aa_{na}$ | $Ba_2$ | $A_{na}B_2$ |  | $Ba_{nb}$ | $Ca_2$ | $B_{nb}C_2$ |
|  | . | . | . |  | . | . | . |
|  | $Aa_{na}$ | $Ba_{nb}$ | $A_{na}B_{nb}$ |  | $Ba_{nb}$ | $Ca_{nc}$ | $B_{nb}C_{nc}$ |
| A AND C | $Aa_1$ | $Ca_1$ | $A_1C_1$ | B AND D | $Ba_1$ | $Da_1$ | $B_1D_1$ |
|  | $Aa_1$ | $Ca_2$ | $A_1C_2$ |  | $Ba_1$ | $Da_2$ | $B_1D_2$ |
|  | . | . | . |  | . | . | . |
|  | $Aa_1$ | $Ca_{nc}$ | $A_1C_{nc}$ |  | $Ba_1$ | $Da_{nd}$ | $B_1D_{nd}$ |
|  | $Aa_2$ | $Ca_1$ | $A_2C_1$ |  | $Ba_2$ | $Da_1$ | $B_2D_1$ |
|  | $Aa_2$ | $Ca_2$ | $A_2C_2$ |  | $Ba_2$ | $Da_2$ | $B_2D_2$ |
|  | . | . | . |  | . | . | . |
|  | $Aa_2$ | $Ca_{nc}$ | $A_2C_{nc}$ |  | $Ba_2$ | $Da_{nd}$ | $B_2D_{nd}$ |
|  | . | . | . |  | . | . | . |
|  | $Aa_{na}$ | $Ca_1$ | $A_{na}C_1$ |  | $Ba_{nb}$ | $Da_1$ | $B_{nb}D_1$ |
|  | $Aa_{na}$ | $Ca_2$ | $A_{na}C_2$ |  | $Ba_{nb}$ | $Da_2$ | $B_{nb}D_2$ |
|  | . | . | . |  | . | . | . |
|  | $Aa_{na}$ | $Ca_{nc}$ | $A_{na}C_{nc}$ |  | $Ba_{nb}$ | $Da_{nd}$ | $B_{nb}D_{nd}$ |
| A AND D | $Aa_1$ | $Da_1$ | $A_1D_1$ | C AND D | $Ca_1$ | $Da_1$ | $C_1D_1$ |
|  | $Aa_1$ | $Da_2$ | $A_1D_2$ |  | $Ca_2$ | $Da_2$ | $C_1D_2$ |
|  | . | . | . |  | . | . | . |
|  | $Aa_1$ | $Da_{nd}$ | $A_1D_{nd}$ |  | $Ca_{nc}$ | $Da_{nd}$ | $C_1D_{nd}$ |
|  | $Aa_2$ | $Da_1$ | $A_2D_1$ |  | $Ca_1$ | $Da_1$ | $C_2D_1$ |
|  | $Aa_2$ | $Da_2$ | $A_2D_2$ |  | $Ca_2$ | $Da_2$ | $C_2D_2$ |
|  | . | . | . |  | . | . | . |
|  | $Aa_2$ | $Da_{nd}$ | $A_2D_{nd}$ |  | $Ca_{nc}$ | $Da_{nd}$ | $C_2D_{nd}$ |
|  | . | . | . |  | . | . | . |
|  | $Aa_{na}$ | $Da_1$ | $A_{na}D_1$ |  | $Ca_1$ | $Da_1$ | $C_{nc}D_1$ |
|  | $Aa_{na}$ | $Da_2$ | $A_{na}D_2$ |  | $Ca_2$ | $Da_2$ | $C_{nc}D_2$ |
|  | . | . | . |  | . | . | . |
|  | $Aa_{na}$ | $Da_{nd}$ | $A_{na}D_{nd}$ |  | $Ca_{nc}$ | $Da_{nd}$ | $C_{nc}D_{nd}$ |

FIG. 20

| COMBINATION | IMAGE | IMAGE | CORRELATION COEFFICIENT |
|---|---|---|---|
| A AND B | $Aa_1$ | $Ba_1$ | $A_1B_1$ |
| | $Aa_1$ | $Ba_2$ | $A_1B_2$ |
| | ⋮ | ⋮ | ⋮ |
| | $Aa_1$ | $Ba_{nb}$ | $A_1B_{nb}$ |
| | $Aa_2$ | $Ba_1$ | $A_2B_1$ |
| | $Aa_2$ | $Ba_2$ | $A_2B_2$ |
| | ⋮ | ⋮ | ⋮ |
| | $Aa_2$ | $Ba_{nb}$ | $A_2B_{nb}$ |
| | ⋮ | ⋮ | ⋮ |
| | $Aa_{na}$ | $Ba_1$ | $A_{na}B_1$ |
| | $Aa_{na}$ | $Ba_2$ | $A_{na}B_2$ |
| | ⋮ | ⋮ | ⋮ |
| | $Aa_{na}$ | $Ba_{nb}$ | $A_{na}B_{nb}$ |
| | $Aa_1$ | REVERSED: $Ba_1$ | REVERSED: $A_1B_1$ |
| | $Aa_1$ | REVERSED: $Ba_2$ | REVERSED: $A_1B_2$ |
| | ⋮ | ⋮ | ⋮ |
| | $Aa_1$ | REVERSED: $Ba_{nb}$ | REVERSED: $A_1B_{nb}$ |
| | $Aa_2$ | REVERSED: $Ba_1$ | REVERSED: $A_2B_1$ |
| | $Aa_2$ | REVERSED: $Ba_2$ | REVERSED: $A_2B_2$ |
| | ⋮ | ⋮ | ⋮ |
| | $Aa_2$ | REVERSED: $Ba_{nb}$ | REVERSED: $A_2B_{nb}$ |
| | ⋮ | ⋮ | ⋮ |
| | $Aa_{na}$ | REVERSED: $Ba_1$ | REVERSED: $A_{na}B_1$ |
| | $Aa_{na}$ | REVERSED: $Ba_2$ | REVERSED: $A_{na}B_2$ |
| | ⋮ | ⋮ | ⋮ |
| | $Aa_{na}$ | REVERSED: $Ba_{nb}$ | REVERSED: $A_{na}B_{nb}$ |

FIG. 21

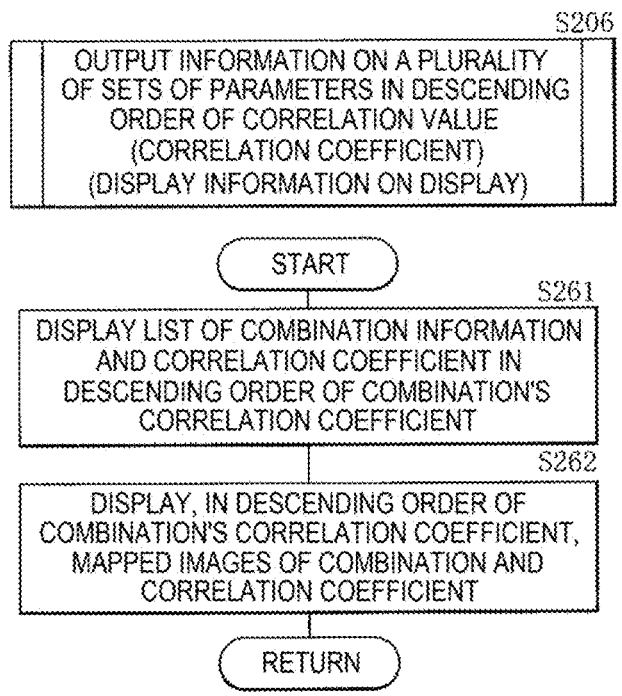

FIG. 22

| rank | COMBINATION | CORRELATION COEFFICIENT |
|---|---|---|
| 1 | LASER APPARATUS: SPECTRAL LINEWIDTH $\Delta\lambda$ ⇔ WAFER INSPECTION APPARATUS: FORMED PATTERN LINEWIDTH W | 80% |
| 2 | LASER APPARATUS: WAVELENGTH $\lambda$ ⇔ EXPOSURE APPARATUS: FOCUS POSITION Z | 50% |
| 3 | EXPOSURE APPARATUS: EXPOSURE ENERGY ⇔ WAFER INSPECTION APPARATUS: NUMBER OF DEFECTS D | 30% |
| 4 | LASER APPARATUS: WAVELENGTH $\lambda$ ⇔ WAFER INSPECTION APPARATUS: HEIGHT DISTRIBUTION H | 10% |
| 5 | EXPOSURE APPARATUS: FOCUS POSITION Z ⇔ REVERSED: WAFER INSPECTION APPARATUS: HEIGHT DISTRIBUTION H | 5% |
| 6 | ... | ... |
| ... | ... | ... |

FIG. 23
Wafer#1
No. 1 LASER APPARATUS: SPECTRAL LINEWIDTH Δλ ⇔ WAFER
INSPECTION APPARATUS: FORMED PATTERN LINEWIDTH W
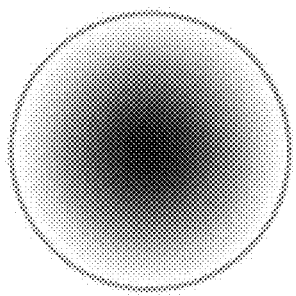 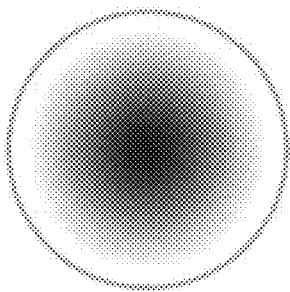
CORRELATION COEFFICIENT 80%
Wafer#1
No. 2 LASER APPARATUS: WAVELENGTH λ ⇔ EXPOSURE
APPARATUS: FOCUS POSITION Z
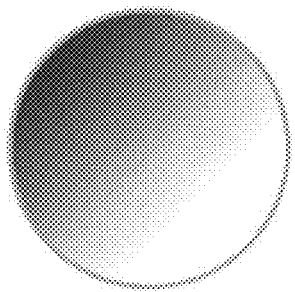 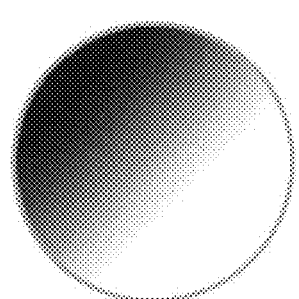
CORRELATION COEFFICIENT 50%

| COMBINATION | IMAGE | IMAGE | CORRELATION COEFFICIENT |
|---|---|---|---|
| A AND A | $Aa_1$ | $Aa_2$ | $Aa_1Aa_2$ |
| | $Aa_1$ | $Aa_3$ | $Aa_1Aa_3$ |
| | $Aa_1$ | $Aa_4$ | $Aa_1Aa_4$ |
| | $Aa_1$ | $Aa_5$ | $Aa_1Aa_5$ |
| | $Aa_1$ | $Aa_6$ | $Aa_1Aa_6$ |
| | $Aa_2$ | $Aa_3$ | $Aa_2Aa_3$ |
| | $Aa_2$ | $Aa_4$ | $Aa_2Aa_4$ |
| | $Aa_2$ | $Aa_5$ | $Aa_2Aa_5$ |
| | $Aa_2$ | $Aa_6$ | $Aa_2Aa_6$ |
| | $Aa_3$ | $Aa_4$ | $Aa_3Aa_4$ |
| | $Aa_3$ | $Aa_5$ | $Aa_3Aa_5$ |
| | $Aa_3$ | $Aa_6$ | $Aa_3Aa_6$ |
| | $Aa_4$ | $Aa_5$ | $Aa_4Aa_5$ |
| | $Aa_4$ | $Aa_6$ | $Aa_4Aa_6$ |
| | $Aa_5$ | $Aa_6$ | $Aa_5Aa_6$ |

DATA ANALYZER, SEMICONDUCTOR MANUFACTURING SYSTEM, DATA ANALYSIS METHOD, AND SEMICONDUCTOR MANUFACTURING METHOD

CROSS-REFERENCE TO RELATED APPLICATIONS

The present application is a continuation application of International Application No. PCT/JP2017/030907 filed on Aug. 29, 2017. The content of the application is incorporated herein by reference in its entirety.

BACKGROUND

1. Technical Field

The present disclosure relates to a data analyzer, a semiconductor manufacturing system, a data analysis method, and a semiconductor manufacturing method.

2. Related Art

In recent years, a semiconductor exposure apparatus (hereinafter referred to as an "exposure apparatus") is required to improve the resolution as a semiconductor integrated circuit is increasingly miniaturized and highly integrated. To improve the resolution of an exposure apparatus, reduction in the wavelength of the light emitted from a light source for exposure is underway. In general, a gas laser apparatus is used as the light source for exposure in place of a mercury lamp in related art. For example, a KrF excimer laser apparatus configured to emit an ultraviolet laser beam having a wavelength of 248 nm or an ArF excimer laser apparatus configured to emit an ultraviolet laser beam having a wavelength of 193 nm is used as a gas laser apparatus for exposure.

As a next-generation exposure technology, liquid-immersion exposure, in which the gap between the exposure lens of the exposure apparatus and a wafer is filled with a liquid, has been put into use. In the liquid-immersion exposure, since the refractive index of the gap between the exposure lens and the wafer changes, the apparent wavelength of the light from the light source for exposure shortens. In the liquid-immersion exposure using an ArF excimer laser apparatus as the light source for exposure, the wafer is irradiated with ultraviolet light having a wavelength of 134 nm in water. The technology described above is called ArF liquid-immersion exposure (or ArF liquid-immersion lithography).

KrF and ArF excimer laser apparatuses each have a wide spontaneous oscillation width ranging from about 350 to 400 pm. A projection lens made of a material that transmits ultraviolet light, such as the KrF laser beam and the ArF laser beam, therefore undesirably produces chromatic aberrations in some cases. As a result, the resolution of the projection lens could decrease. To avoid the decrease in the resolution, the spectral linewidth of the laser beam emitted from the gas laser apparatus needs to be narrow enough to make the chromatic aberrations negligible. A line narrowing module (LNM) including a line narrowing element (such as etalon and grating) is therefore provided in the laser resonator of the gas laser apparatus to narrow the spectral linewidth in some cases. A laser apparatus having a narrowed spectral linewidth is hereinafter referred to as a narrowed-linewidth laser apparatus.

CITATION LIST

Patent Literature

[PTL 1] WO 2014/30645
[PTL 2] JP-A-2013-174575
[PTL 3] JP-A-2004-281461
[PTL 4] WO 2017/68619

SUMMARY

A data analyzer according to the present disclosure includes a data collector configured to acquire data on each analysis target parameter of each of a plurality of apparatuses from the apparatus, the plurality of apparatuses including a light source apparatus, an exposure apparatus configured to expose a wafer to pulsed light outputted from the light source apparatus, and a wafer inspection apparatus configured to inspect the wafer exposed by the exposure apparatus, an image generator configured to visualize the data on each of the plurality of parameters collected by the data collector from the plurality of apparatuses that process the wafer for each predetermined area of the wafer to convert the data into an image and generate a plurality of mapped images for each of the parameters of the plurality of apparatuses, and a correlation computing section configured to perform pattern matching on arbitrary mapped images out of the plurality of mapped images generated from the wafer to determine a correlation value between arbitrary parameters out of the plurality of parameters of the plurality of apparatuses.

A semiconductor manufacturing system according to the present disclosure includes a plurality of apparatuses including a light source apparatus, an exposure apparatus configured to expose a wafer to pulsed light outputted from the light source apparatus, and a wafer inspection apparatus configured to inspect the wafer exposed by the exposure apparatus, a data collector configured to acquire data on each analysis target parameter of each of the plurality of apparatuses from the apparatus, an image generator configured to visualize the data on each of the plurality of parameters collected by the data collector from the plurality of apparatuses that process the wafer for each predetermined area of the wafer to convert the data into an image and generate a plurality of mapped images for each of the parameters of the plurality of apparatuses, a correlation computing section configured to perform pattern matching on arbitrary mapped images out of the plurality of mapped images generated from the wafer to determine a correlation value between arbitrary parameters out of the plurality of parameters of the plurality of apparatuses, and a controller configured to change a parameter relating to control of at least one apparatus out of the plurality of apparatuses based on the correlation value between the parameters.

A data analysis method according to the present disclosure includes acquiring data on each analysis target parameter of each of a plurality of apparatuses from the apparatus, the plurality of apparatuses including a light source apparatus, an exposure apparatus configured to expose a wafer to pulsed light outputted from the light source apparatus, and a wafer inspection apparatus configured to inspect the wafer exposed by the exposure apparatus, visualizing the data on each of the plurality of parameters acquired from the plurality of apparatuses that process the wafer for each predetermined area of the wafer to convert the data into an image and generating a plurality of mapped images for each of the parameters of the plurality of apparatuses, and performing pattern matching on arbitrary mapped images out of the plurality of mapped images generated from the wafer to determine a correlation value between arbitrary parameters out of the plurality of parameters of the plurality of apparatuses.

A semiconductor manufacturing method according to the present disclosure includes acquiring data on each analysis target parameter of each of a plurality of apparatuses from the apparatus, the plurality of apparatuses including a light source apparatus, an exposure apparatus configured to expose a wafer to pulsed light outputted from the light source apparatus, and a wafer inspection apparatus configured to inspect the wafer exposed by the exposure apparatus, visualizing the data on each of the plurality of parameters acquired from the plurality of apparatuses that process the wafer for each predetermined area of the wafer to convert the data into an image and generating a plurality of mapped images for each of the parameters of the plurality of apparatuses, performing pattern matching on arbitrary mapped images out of the plurality of mapped images generated from the wafer to determine a correlation value between arbitrary parameters out of the plurality of parameters of the plurality of apparatuses, and changing a parameter relating to control of at least one apparatus out of the plurality of apparatuses based on the correlation value between the parameters.

BRIEF DESCRIPTION OF THE DRAWINGS

Embodiments of the present disclosure will be described below only by way of example with reference to the accompanying drawings.

FIG. 5A schematically shows an example of data stored in the memory of the terminal apparatus.

FIG. 5B schematically shows another example of the data stored in the memory of the terminal apparatus.

FIG. 14 schematically shows an example of a mapped image having undergone digital image filtering.

FIG. 19 schematically shows an example of the combinations of mapped images and an example of correlation coefficients corresponding to the combinations.

FIG. 20 schematically shows an example of the combinations of reversed mapped images and an example of correlation coefficients corresponding to the combinations.

FIG. 21 is a sub-flowchart showing in detail the processes in step S206 in the flowchart shown in FIG. 8.

FIG. 22 schematically shows an example of a list outputted as information on the parameters.

FIG. 23 schematically shows an example of the mapped images and the correlation coefficient outputted as information on the parameters.

DETAILED DESCRIPTION

Figure 1:
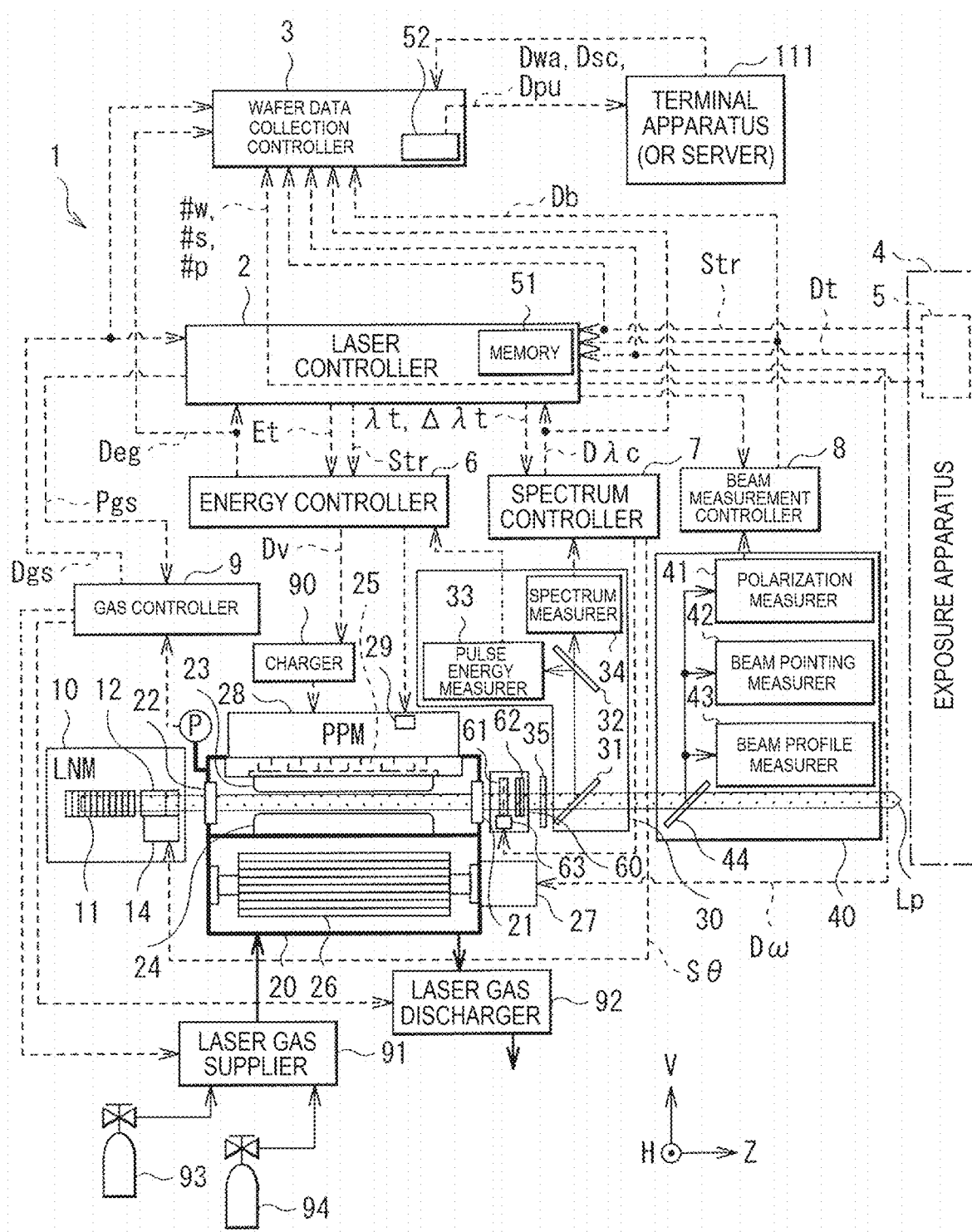
FIG. 1 schematically shows an example of the configurations of a laser apparatus and a laser apparatus managing system according to Comparative Example.

<Contents>
<1. Comparative Example> (Laser Apparatus and Laser Apparatus Managing System) (FIG. 1 to FIGS. 5A and 5B)
1.1 Configuration
1.2 Operation
1.3 Problems
<2. First Embodiment> (Semiconductor Manufacturing System Including Data Analyzer) (FIGS. 6 to 25)
2.1 Configuration
2.2 Operation
2.3 Advantages/effects
2.4 Variations
<3. Second Embodiment> (Data Analyzer Having Parameter Feedback Control Function and Semiconductor Manufacturing System) (FIGS. 26 to 29)
3.1 Configuration
3.2 Operation
3.3 Advantages/effects
<4. Others>

Embodiments of the present disclosure will be described below in detail with reference to the drawings.

The embodiments described below show some examples of the present disclosure and are not intended to limit the contents of the present disclosure. Further, all configurations and operations described in the embodiments are not necessarily essential as configurations and operations in the present disclosure.

The same component has the same reference character, and no redundant description of the same component will be made.

<1. Comparative Example> (Laser Apparatus and Laser Apparatus Managing System)

[1.1 Configuration]

FIG. 1 schematically shows an example of the configurations of a laser apparatus and a laser apparatus managing system according to Comparative Example.

In the present specification, a direction Z is the direction of the optical path axis of a laser beam. Two directions substantially perpendicular to the direction Z may be directions H and V. The direction H is a direction substantially perpendicular to the plane of FIG. 1. In Comparative Example and embodiments below, a laser apparatus 1 is presented by way of example as an apparatus configured to supply an exposure apparatus 4 with pulsed light, but not necessarily. The apparatus configured to supply the exposure apparatus 4 with pulsed light may instead, for example, be an EUV light source apparatus configured to generate extreme ultraviolet (EUV) light. In the present specification, a light source apparatus is defined to be the apparatus configured to supply the exposure apparatus 4 with pulsed light.

A laser apparatus managing system according to Comparative Example includes the laser apparatus 1 and a terminal apparatus 111. The terminal apparatus 111 is a terminal operated by the laser manufacturer of the laser apparatus 1, such as a personal computer (PC). The terminal apparatus 111 may, for example, be a server connected to a plurality of apparatuses including the laser apparatus 1 over a network.

The laser apparatus 1 is a light source apparatus configured to output pulsed laser beams Lp as the pulsed light. The laser apparatus 1 includes a laser output section configured to perform laser oscillation and output the pulsed laser beams Lp toward the exposure apparatus 4. The laser output section includes a laser chamber 20, to which a laser gas is supplied, a line narrowing module (LNM) 10, an output coupling mirror 35 as an output coupler (OC).

The exposure apparatus 4 is an apparatus configured to perform wafer exposure. The wafer exposure includes performing scanning exposure. The "scanning exposure" is a method for scanning the wafer with the pulsed laser beams Lp to expose each exposure region to the pulsed laser beams Lp.

The laser apparatus 1 operates in burst operation in accordance with the wafer exposure performed by the exposure apparatus 4. The "burst operation" is operation configured to alternately repeat a burst period in which continuous oscillation of the linewidth-narrowed pulsed laser beams Lp is performed in accordance with the scanning exposure and an oscillation pause period in which the laser oscillation is paused.

Figure 2:
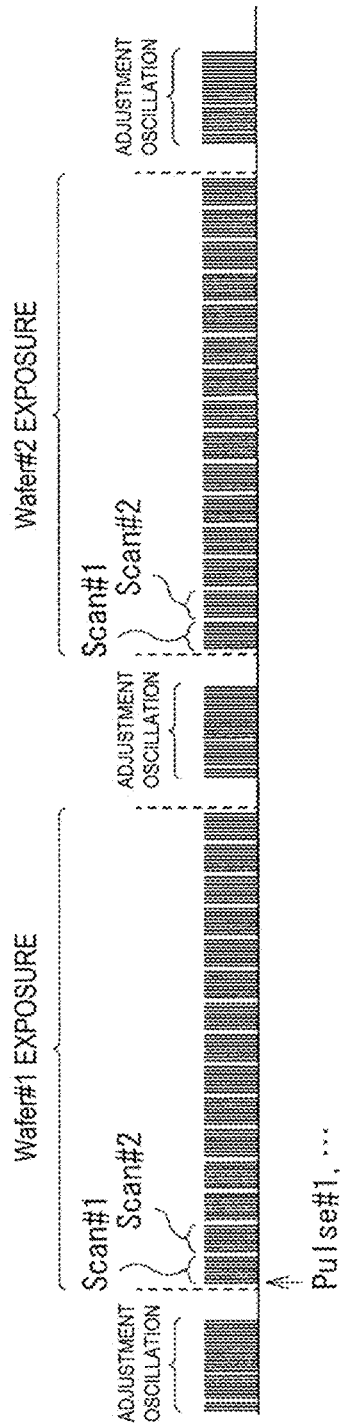
FIG. 2 diagrammatically shows an example of the output timing of pulsed laser beams outputted by the laser apparatus that operates in burst operation.
Figure 3:
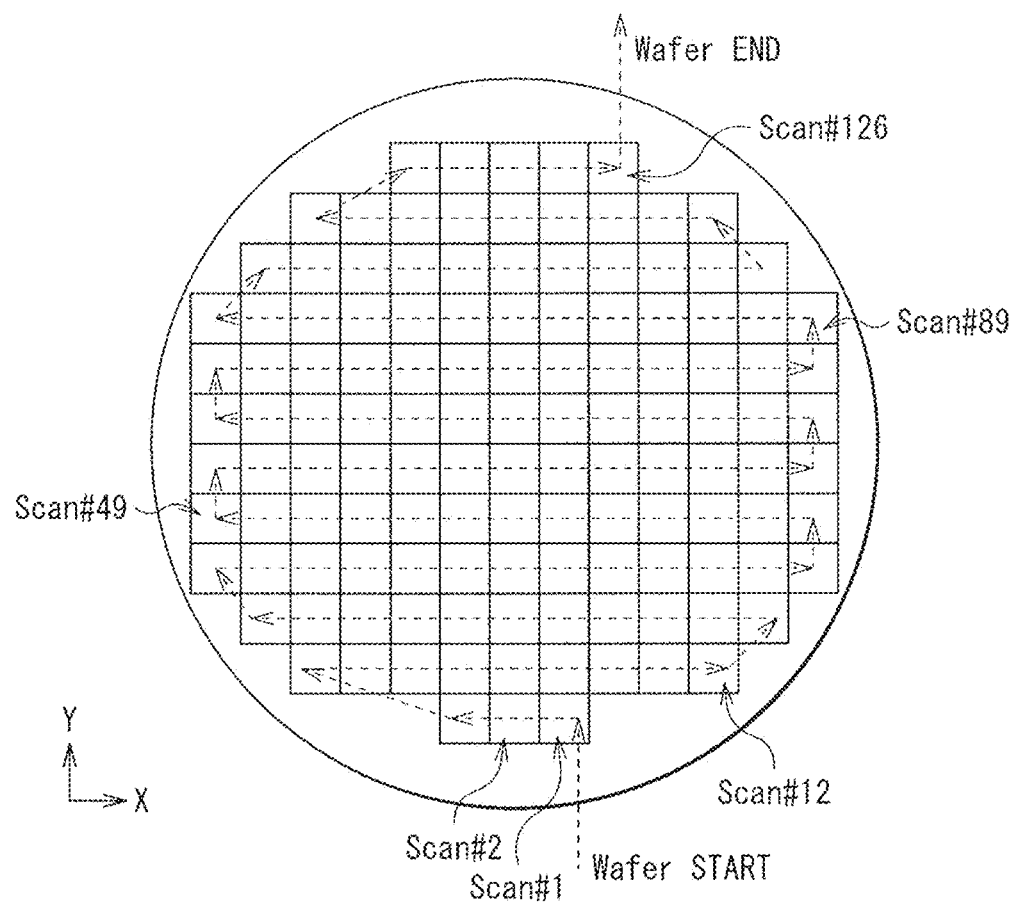
FIG. 3 diagrammatically shows an overview of scanning exposure.

Before a description of the configuration of the laser apparatus managing system, overviews of the burst operation and the wafer exposure will be described. FIG. 2 diagrammatically shows an example of the output timing of the pulsed laser beams Lp outputted by the laser apparatus 1 that operates in the burst operation. FIG. 3 diagrammatically shows the overview of the scanning exposure.

In FIG. 2, a single vertical line represents the pulsed laser beam Lp corresponding to one pulse. The laser apparatus 1 first performs adjustment oscillation, waits for a predetermined period, and then performs the burst operation for the wafer exposure performed on a first wafer (Wafer #1), as shown in FIG. 2. The adjustment oscillation is laser oscillation operation of outputting the pulsed laser beams Lp for adjustment without the wafer irradiated with the pulsed laser beams Lp. The pulsed laser beams Lp are outputted at a predetermined frequency ranging, for example, from about several hundred hertz to several kilohertz. In the wafer exposure, it is typical to perform the burst operation, in which the burst period and the oscillation pause period are repeated. The burst operation is performed also in the adjustment oscillation. In FIG. 2, a segment where the density of pulses is high is the burst period, in which the pulsed laser beams Lp are continuously outputted for a predetermined period. In FIG. 2, the segment where no pulse is present may be the oscillation pause period. In the adjustment oscillation, the length of each continuous pulse output period is not necessarily fixed, and the continuous output operation may be so performed that continuous output periods may differ from one another for adjustment purposes.

After the adjustment oscillation, the exposure apparatus 4 waits for a relatively long period and then performs the wafer exposure on a first wafer (Wafer #1). The wafer exposure is so performed that the wafer is divided into a plurality of predetermined exposure regions and the scanning exposure is performed on an exposure region basis in the period between the start of the wafer exposure (Wafer START) and the end of the wafer exposure (Wafer END), as shown in FIG. 3. That is, in the wafer exposure, a first predetermined exposure region of the wafer is exposed to the pulsed laser beams Lp in first scanning exposure (Scan #1), then a second predetermined exposure region of the wafer is exposed to the pulsed laser beams Lp in second scanning exposure (Scan #2), and the same step is repeated for the following predetermined exposure regions. During a single action of scanning exposure, the laser apparatus 1 may continuously output a plurality of pulsed laser beams Lp (Pulse #1, Pulse #2, . . . ). When the scanning exposure performed on the first predetermined exposure region (Scan #1) is completed, a predetermined period is allowed to elapse, and the scanning exposure is performed on the second predetermined exposure region (Scan #2). After the scanning exposure is sequentially repeated and performed on all exposure regions of the first wafer, the adjustment oscillation is performed again, and the wafer exposure is performed on the second wafer (Wafer #2).

The laser apparatus managing system is a system that collects a variety of data on the laser apparatus 1 that performs the wafer exposure described above and manages the collected data.

Referring back to FIG. 1, the description of the configuration of the laser apparatus managing system will be resumed.

The laser apparatus 1 further includes a laser controller 2, a wafer data collection controller 3, an energy controller 6, a spectrum controller 7, a beam measurement controller 8, and a gas controller 9. The laser apparatus 1 still further includes a monitor module (MM) 30, a beam measurer (BPM) 40, a spectrum changer 60, a charger 90, a laser gas supplier 91, and a laser gas discharger 92.

The laser chamber 20 includes windows 21 and 22, a pair of discharge electrodes 23 and 24, an electrically insulating member 25, a cross-flow fan (CFF) 26, a motor 27, and a pulse power module (PPM) 28.

The electrically insulating member 25 may be made, for example, of an alumina ceramic material. The pulse power module 28 includes a switch 29 and is connected to the discharge electrode 23 via a feedthrough that is not shown but is part of the electrically insulating member 25. The discharge electrode 24 is connected to the laser chamber 20, which is grounded.

The line narrowing module 10 and the output coupling mirror 35 form an optical resonator. The laser chamber 20 is so disposed that the discharge region of the pair of discharge electrodes 23 and 24 is located in the optical path of the resonator. A multilayer film configured to reflect part of the laser beam generated in the laser chamber 20 and transmit the remainder is coated on the output coupling mirror 35.

The line narrowing module 10 includes a grating 11, a prism 12, and a rotary stage 14 configured to rotate the prism 12.

The prism 12 is so disposed as to enlarge the laser beam outputted from the laser chamber 20 and cause the enlarged beam to be incident on the grating 11 at a predetermined angle of incidence.

The rotary stage 14 is so disposed that the angle of incidence of the laser beam incident on the grating 11 changes when the prism 12 rotates. The grating 11 is disposed in a Littrow arrangement that causes the angle of incidence of the laser beam to be equal to the angle of diffraction of the laser beam.

The charger 90 is so electrically connected to the pulse power module 28 as to charge a charging capacitor of the pulse power module 28 that is a capacitor not shown but having a capacity C0. The charger 90 receives charging voltage data Dv representing charging voltage V from the energy controller 6.

An exposure apparatus controller 5 of the exposure apparatus 4 inputs a light emission trigger signal Str to the laser controller 2. The light emission trigger signal Str is inputted to the energy controller 6 via the laser controller 2. The energy controller 6 and the pulse power module 28 are so electrically connected to each other that the switch 29 is turned on and off in synchronization with the light emission trigger signal Str.

The monitor module 30 includes beam splitters 31 and 32, a pulse energy measurer 33, and a spectrum measurer 34.

The beam splitter 31 is disposed in the optical path of the pulsed laser beam Lp having exited via the output coupling mirror 35. The beam splitter 32 is disposed in the optical path of the pulsed laser beam Lp reflected off the beam splitter 31. The beam splitter 32 is so disposed that the beam reflected off the beam splitter 32 is incident on the pulse energy measurer 33 and the beam passing through the beam splitter 32 is incident on the spectrum measurer 34.

The pulse energy measurer 33 includes a light collection lens and a photosensor that are not shown. The photosensor may be a high-speed photodiode configured to be resistant to ultraviolet light.

The spectrum measurer 34 may be a spectrometer including an etalon that is not shown. For example, the spectrum measurer 34 may be a monitor etalon spectrometer including the following components that are not shown: a monitor etalon; a light collection lens; and an image sensor configured to measure interference fringes that pass through the monitor etalon and are produced by the light collection lens on the focal plane thereof.

The beam measurer 40 includes a polarization measurer 41, a beam pointing measurer 42, a beam profile measurer 43, and a beam splitter 44. The beam splitter 44 is disposed in the optical path of the pulsed laser beam Lp having exited via the output coupling mirror 35.

The beam measurement controller 8 calculates beam measurement related data db based on image data measured with the beam measurer 40. Signal lines configured to transmit the beam measurement related data db to the laser controller 2 and the wafer data collection controller 3 are provided between the beam measurement controller 8 and the laser controller 2 and between the beam measurement controller 8 and the wafer data collection controller 3.

A signal line configured to transmit a stage angle control signal $S\theta$ for controlling a rotary stage angle $\theta$ of the rotary stage 14 to the rotary stage 14 is provided between the spectrum controller 7 and the rotary stage 14 of the line narrowing module 10. The rotary stage angle $\theta$ of the rotary stage 14 is controlled based on a wavelength $\lambda$ detected with the spectrum measurer 34.

Signal lines configured to transmit spectrum control related data $D\lambda c$ based on the result of the measurement performed by the spectrum measurer 34 to the laser controller 2 and the wafer data collection controller 3 are provided between the spectrum controller 7 and the laser controller 2 and between the spectrum controller 7 and the wafer data collection controller 3.

The spectrum changer 60 is disposed in the optical path between the laser chamber 20 and the output coupling mirror 35. The spectrum changer 60 includes a cylindrical concave lens 61, a cylindrical convex lens 62, and a linear stage 63. As a variation of the spectrum changer 60, the spectrum changer 60 may have a configuration in which one surface of the cylindrical convex lens 62 that is the surface farthest from the laser chamber 20 is a flat surface and a partial reflection film is coated on the flat surface so that the flat surface also functions as the output coupling mirror. In this case, no output coupling mirror 35 is disposed.

The cylindrical concave lens 61 and the cylindrical convex lens 62 are disposed in the optical path between the laser chamber 20 and the output coupling mirror 35. The inter-lens distance between the cylindrical concave lens 61 and the cylindrical convex lens 62 is changed by the linear stage 63.

A signal line configured to transmit a stage position control signal for controlling a stage position X of the linear stage 63 from the spectrum controller 7 to the linear stage 63 is provided between the spectrum controller 7 and the linear stage 63.

A signal line configured to transmit the charging voltage data Dv representing the charging voltage V from the energy controller 6 to the charger 90 is provided between the energy controller 6 and the charger 90. The charging voltage V is controlled based on pulse energy E measured with the pulse energy measurer 33. The charging voltage V is voltage that charges the charging capacitor that is not shown but is provided in the pulse power module 28.

Signal lines configured to transmit energy control related data Deg based on the result of the measurement performed by the pulse energy measurer 33 to the laser controller 2 and the wafer data collection controller 3 are provided between the energy controller 6 and the laser controller 2 and between the energy controller 6 and the wafer data collection controller 3.

A signal line configured to transmit gas control related data Dgs to the laser controller 2 is provided between the gas controller 9 and the laser controller 2.

The laser gas supplier 91 is configured to be capable of supplying the interior of the laser chamber 20 with a buffer gas and a fluorine-containing gas, as the laser gas, based on a control signal from the gas controller 9. The buffer gas is the mixture of Ar and Ne. The fluorine-containing gas is the mixture of Ar, Ne, and $F_2$. The laser gas supplier 91 is connected to a gas cylinder 93 configured to supply the Ar+Ne mixture gas as the buffer gas and a gas cylinder 94 configured to supply the Ar+Ne+$F_2$ mixture gas as the fluorine-containing gas. The laser gas supplier 91 includes a valve configured to control the supply of the Ar+Ne mixture gas from the gas cylinder 93 and a valve configured to control the supply of the Ar+Ne+$F_2$ mixture gas from the gas cylinder 94.

The laser gas discharger 92 is configured to be capable of discharging the laser gas in the laser chamber 20 in response to a control signal from the gas controller 9. The laser gas discharger 92 includes a valve configured to control the discharge operation, a discharge pump, and a halogen filter configured to trap the $F_2$ gas in the discharged gas.

The wafer data collection controller 3 includes a memory 52. The memory 52 stores wafer-basis data Dwa, scan-basis data Dsc, and pulse-basis data Dpu. The wafer-basis data Dwa, the scan-basis data Dsc, and the pulse-basis data Dpu stored in the memory 52 can be referred to from the terminal apparatus 111.

The laser controller 2 includes a memory 51. The memory 51 stores a variety of data and data on a variety of parameters.

A signal line configured to transmit a gas control parameter Pgs for gas control to the gas controller 9 is provided between the laser controller 2 and the gas controller 9.

A signal line configured to transmit data on target pulse energy Et for energy control to the energy controller 6 is provided between the laser controller 2 and the energy controller 6. A signal line configured to transmit the light emission trigger signal Str to the energy controller 6 is provided between the laser controller 2 and the energy controller 6.

A signal line configured to transmit data on a target wavelength λt and data on a target spectral linewidth Δλt for spectrum control to the spectrum controller 7 is provided between the laser controller 2 and the spectrum controller 7.

A signal line configured to transmit the light emission trigger signal Str to the beam measurer 40 is provided between the laser controller 2 and the beam measurer 40.

A signal line configured to transmit rotational speed data Do) for controlling a rotational speed to of the cross-flow fan 26 to the motor 27 is provided between the laser controller 2 and the motor 27 in the laser chamber 20.

A signal line configured to transmit various target data Dt to the laser controller 2 is provided between the exposure apparatus controller 5 and the laser controller 2. The various target data Dt contains the target pulse energy Et, the target wavelength λt, and the target spectral linewidth Δλt.

(Data Management)

The laser controller 2 saves various data in the memory 51 on a regular basis, for example, on a fixed period cycle basis or a fixed shot number basis. The various data contains, for example, at least one of the energy control related data Deg, the spectrum control related data Dλc, the gas control related data Dgs, and the beam measurement related data db.

The wafer data collection controller 3 is configured to be capable of recognizing wafer exposure related information in the exposure apparatus 4 by receiving the light emission trigger signal Str for achieving the exposure pattern shown in FIG. 2 and measuring a trigger period interval. The wafer exposure related information contains a wafer number #w as wafer identification information, a scan number #s as scan identification information, and a pulse number #p as pulse identification information.

The wafer data collection controller 3 is configured to be capable of saving the various data described above in the memory 52 after performing calculation that relates the various data to the wafer exposure related information described above.

The data saved in the memory 52 can be referred to as the wafer-basis data Dwa, the scan-basis data Dsc, and the pulse-basis data Dpu from the terminal apparatus 111.

The wafer-basis data Dwa, the scan-basis data Dsc, and the pulse-basis data Dpu contain the wafer exposure related information in the exposure apparatus 4 and laser control related information in the laser apparatus 1 associated with each other. The wafer exposure related information contains the wafer number #w as the wafer identification information, the scan number #s as the scan identification information, and the pulse number #p as the pulse identification information. Data on the laser control related information associated with the wafer exposure related information contains, for example, at least one of the energy control related data Deg, the spectrum control related data Dλc, the gas control related data Dgs, the beam measurement related data db, and a variety of other control related data.

The memory 52 temporarily memorizes the wafer-basis data Dwa, the scan-basis data Dsc, and the pulse-basis data Dpu. The wafer-basis data Dwa is data on a wafer basis used to perform the wafer exposure. The scan-basis data Dsc c is data on a scan basis used to perform the scanning exposure. The pulse-basis data Dpu is data on a pulsed laser beam basis used to perform the scanning exposure. The period for which any of the data described above is saved in the memory 52 is a predetermined default period determined in advance.

The period for which any of the data described above is saved in the memory 52 may instead be settable or changeable via the terminal apparatus 111. A signal line configured to transmit a setting signal, such as a signal for setting the period for which any of the data described above is saved in the memory 52, to the wafer data collection controller 3 is provided between the terminal apparatus 111 and the wafer data collection controller 3.

A signal line configured to transmit data on the wafer exposure related information including the wafer number #w, the scan number #s, and the pulse number #p to the laser controller 2 is provided between the exposure apparatus controller 5 and the laser controller 2. A signal line configured to allow the wafer data collection controller 3 to receive the wafer exposure related information via the laser controller 2 is provided between the laser controller 2 and the wafer data collection controller 3.

A signal line configured to transmit the gas control related data Dgs to the wafer data collection controller 3 is provided between the gas controller 9 and the wafer data collection controller 3.

[1.2 Operation]

Figure 4:
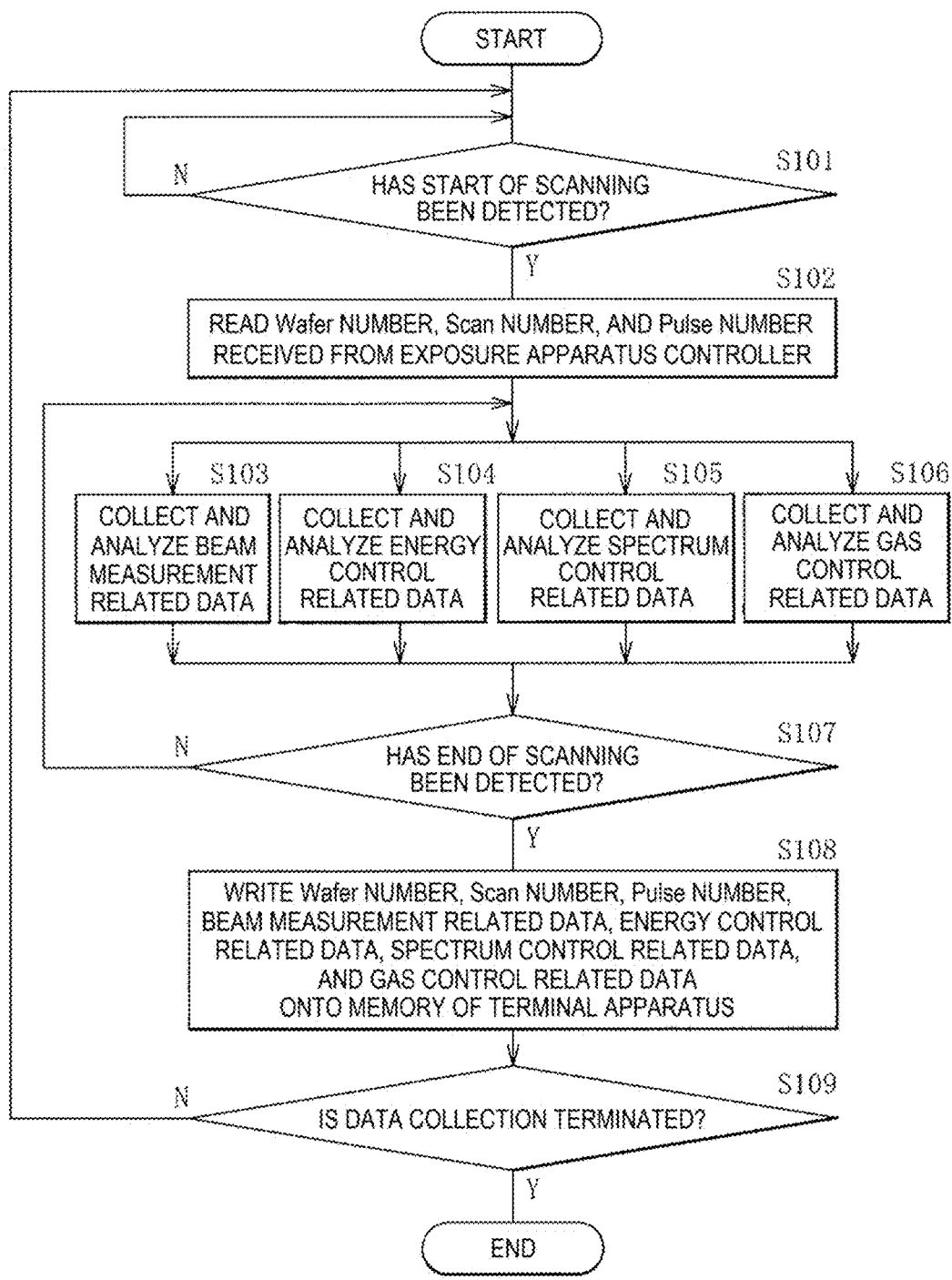
FIG. 4 is a flowchart showing an example of the procedure of data writing control in which a wafer data collection controller writes data onto a memory of a terminal apparatus.

FIG. 4 is a flowchart showing an example of the procedure of data writing control in which the wafer data collection controller 3 writes data onto a memory of the terminal apparatus 111. FIGS. 5A and 5B schematically show an example of data stored in the memory of the terminal apparatus 111.

The wafer data collection controller 3 detects the start of a burst period on a wafer exposure basis shown in FIG. 2. The start of a burst period is detected by evaluating whether or not the start of scanning has been detected (step S101). For example, the wafer data collection controller 3 may detect the start of scanning by receiving the first scan number (Scan #1) from the exposure apparatus controller 5 via the laser controller 2. The wafer data collection controller 3 may still instead detect the start of a burst period by measuring the oscillation pause period to detect a start pulse after at least a predetermined period, for example, an oscillation pause period equal to or longer than 0.1 seconds.

In a case where the result of the evaluation shows that no start of scanning has been detected (N in step S101), the wafer data collection controller 3 repeats the process in step S101.

On the other hand, in a case where the result of the evaluation shows that the start of scanning has been detected (Y in step S101), the wafer data collection controller 3 reads the wafer number #w, the scan number #s, and the pulse number #p received from the exposure apparatus controller 5 via the laser controller 2 (step S102).

The wafer data collection controller 3 then carries out at least one of the processes in steps S103 to S106. The wafer data collection controller 3 collects and analyzes the beam measurement related data db as the process in step S103. The wafer data collection controller 3 collects and analyzes the energy control related data Deg as the process in step S104. The wafer data collection controller 3 collects and analyzes the spectrum control related data D$\lambda$c as the process in step S105. The wafer data collection controller 3 collects and analyzes the gas control related data Dgs as the process in step S106.

The wafer data collection controller 3 then detects the end of a burst period. The end of a burst period is detected by evaluating whether or not the end of scanning has been detected (step S107). For example, the wafer data collection controller 3 may detect the end of scanning when the exposure apparatus controller 5 transmits no valid scan number any more. The wafer data collection controller 3 may still instead detect the end of a burst period by measuring the oscillation pause period to detect an oscillation pause period equal to or longer than a predetermined period, for example, 0.1 seconds.

In a case where the result of the evaluation shows that no end of scanning has been detected (N in step S107), the wafer data collection controller 3 repeats the process in step S107.

On the other hand, in a case where the result of the evaluation shows that the end of scanning has been detected (Y in step S107), the wafer data collection controller 3 writes the collected, analyzed data onto the memory of the terminal apparatus 111 (step S108). The data collected and analyzed by the wafer data collection controller 3 contains the wafer number #w, the scan number #s, and the pulse number #p. The data collected and analyzed by the wafer data collection controller 3 further contains the beam measurement related data db, the energy control related data Deg, the spectrum control related data D$\lambda$c, and the gas control related data Dgs on a pulse basis. FIGS. 5A and 5B show an example of the data written onto the memory of the terminal apparatus 111. As shown in FIGS. 5A and 5B, for example, the beam measurement related data db, the energy control related data Deg, the spectrum control related data D$\lambda$c, and the gas control related data Dgs are related to the wafer number #w, the scan number #s, and the pulse number #p, and the data related to each other are written onto the memory of the terminal apparatus 111.

The wafer data collection controller 3 then evaluates whether or not the data collection is terminated (step S109). In a case where the result of the evaluation shows that the data collection is not terminated (N in step S109), the wafer data collection controller 3 returns to the process in step S101. On the other hand, in a case where the result of the evaluation shows that the data collection is terminated (Y in step S109), the wafer data collection controller 3 terminates the data correction process.

(Others)

The configuration example in FIG. 1 shows the case where an ArF excimer laser is employed, but the present embodiment is not limited thereto. For example, the present embodiment may also be applied to a configuration in which the other excimer laser such as KrF, XeCl, or XeF is used. The laser gas may be produced by introducing a predetermined amount of the mixture of a rare gas and a buffer gas and a predetermined amount of the mixture of the rare gas, the buffer gas, and a halogen gas into the laser chamber 20.

The configuration example in FIG. 1 further shows the case where the single chamber scheme is employed by way of example, but not necessarily. For example, the laser apparatus may include an amplifier in which another laser chamber and another optical resonator are disposed in the optical path between the output coupling mirror 35 and the monitor module 30.

[1.3 Problems]

In the laser apparatus managing system described above, parameters of data to be managed are parameters on the laser apparatus 1. A semiconductor manufacturing system as a whole, however, includes a plurality of other manufacturing apparatuses, such as the exposure apparatus 4 and a wafer inspection apparatus, in addition to the laser apparatus 1. In the exposure process in semiconductor manufacturing, improvement in quality and pursuit of precision are endless tasks. To improve the quality of a manufactured semiconductor, it is necessary to repeat collection of every data provided from a manufacturing apparatus, analysis of the collected data, and feedback of the result of the analysis to the manufacturing process. The laser apparatus 1 also has variations in light emission, but data on the variation has not been sufficiently analyzed on a wafer basis, as in a wafer inspection apparatus or the exposure apparatus 4. Therefore, in the laser apparatus 1, it is difficult to determine which variation in the light emission affects the exposure performance and the final wafer quality even when data analysis on a wafer basis is established because there are a large number of data types. That is, as a semiconductor manufacturing system as a whole, a variety of conditions for improvement in wafer quality and pursuit of manufacturing precision have not been efficiently grasped.

<2. First Embodiment> (Semiconductor Manufacturing System Including Data Analyzer)

A laser apparatus and a laser apparatus managing system according to a first embodiment of the present disclosure will next be described. In the following description, substantially the same portions as the components of the laser apparatus 1 and the laser apparatus managing system according to Comparative Example described above have the same reference characters and will not be described as appropriate.

[2.1 Configuration]

Figure 6:
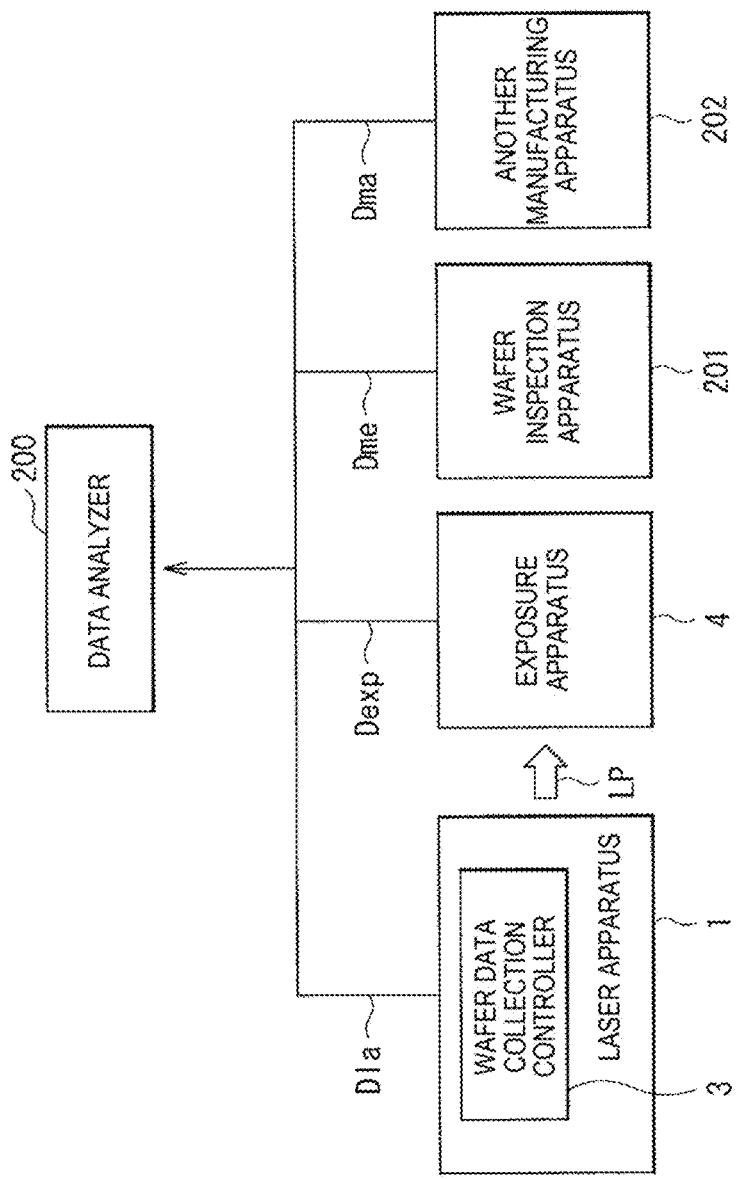
FIG. 6 schematically shows an example of the configuration of a semiconductor manufacturing system according to a first embodiment.

FIG. 6 schematically shows an example of the configuration of a semiconductor manufacturing system according to the first embodiment.

The semiconductor manufacturing system includes a plurality of apparatuses for semiconductor manufacturing and a data analyzer 200 configured to acquire data on each analysis target parameter of each of the plurality of apparatuses from the apparatus on a wafer basis and on a scan basis. The data analyzer 200 may be a terminal, such as a personal computer.

The plurality of apparatuses for semiconductor manufacturing include the laser apparatus 1, the exposure apparatus 4, a wafer inspection apparatus 201, and another manufacturing apparatus 202.

The configuration and operation of the laser apparatus 1 are substantially the same as those in Comparative Example described above except the configuration and operation of the terminal apparatus 111. The data on each analysis target parameter in the laser apparatus 1 is laser related data Dla. The laser related data Dla contains, for example, the following data on a wafer basis and on a scan basis shown in FIGS. 5A and 5B: the beam measurement related data db; the energy control related data Deg; the spectrum control related data Dλc; and the gas control related data Dgs. The beam measurement related data db is data on the beam characteristics of the pulsed laser beam Lp and may contain, for example, data on the beam width and the beam position. The energy control related data Deg is data on the pulse energy E of the pulsed laser beam Lp. The spectrum control related data Dλc is data on the spectrum of the pulsed laser beam Lp and may contain, for example, data on the wavelength λ and the spectral linewidth Δλ.

The exposure apparatus 4 is an apparatus configured to expose a wafer to the pulsed laser beams Lp outputted from the laser apparatus 1. Data on each analysis target parameter in the exposure apparatus 4 is exposure condition data Dexp. The exposure condition data Dexp may contain, for example, data on the following factors on a wafer basis and on a scan basis: the target pulse energy Et; the target wavelength λt; the target spectral linewidth Δλt; pulse energy Pex measured in the exposure apparatus 4; the position where the wafer is brought into focus in the direction Z; and the height position of the wafer surface.

The wafer inspection apparatus 201 is an apparatus configured to inspect a wafer exposed to light by the exposure apparatus 4. The wafer inspection apparatus 201 may be an apparatus configured to irradiate the surface of the wafer with the laser beams and detect variation in a pattern linewidth on the wafer surface on a wafer basis and on a scan basis based on the result of detected variation in a scattered light intensity signal. The wafer inspection apparatus 201 may instead, for example, be an apparatus configured to measure the height of the surface of the wafer and a defect present on the wafer and further measure the location where the defect has occurred and the size of the defect on a wafer basis and on a scan basis. The data on each analysis target parameter in the wafer inspection apparatus 201 is inspection data Dme. The inspection data Dme may contain data on the shape of the wafer and data on defects of the wafer as data on the result of the measurement performed by the wafer inspection apparatus 201. The data on the shape of the wafer may contain, for example, data on the height of the surface of the wafer. The data on defects of the wafer may contain, for example, data on the number of defects and the pattern linewidth.

The other manufacturing apparatus 202 may, for example, be an apparatus configured to coat a resist film on a wafer or a chemical vapor deposition (CVD) apparatus configured to form a thin film. The data on each analysis target parameter in the other manufacturing apparatus 202 is manufacturing data Dma. The manufacturing data Dma may contain data on the following factors measured by the other manufacturing apparatus 202 on a wafer basis and on a scan basis: the thickness of the resist film; and the thickness of the thin film.

Figure 7:
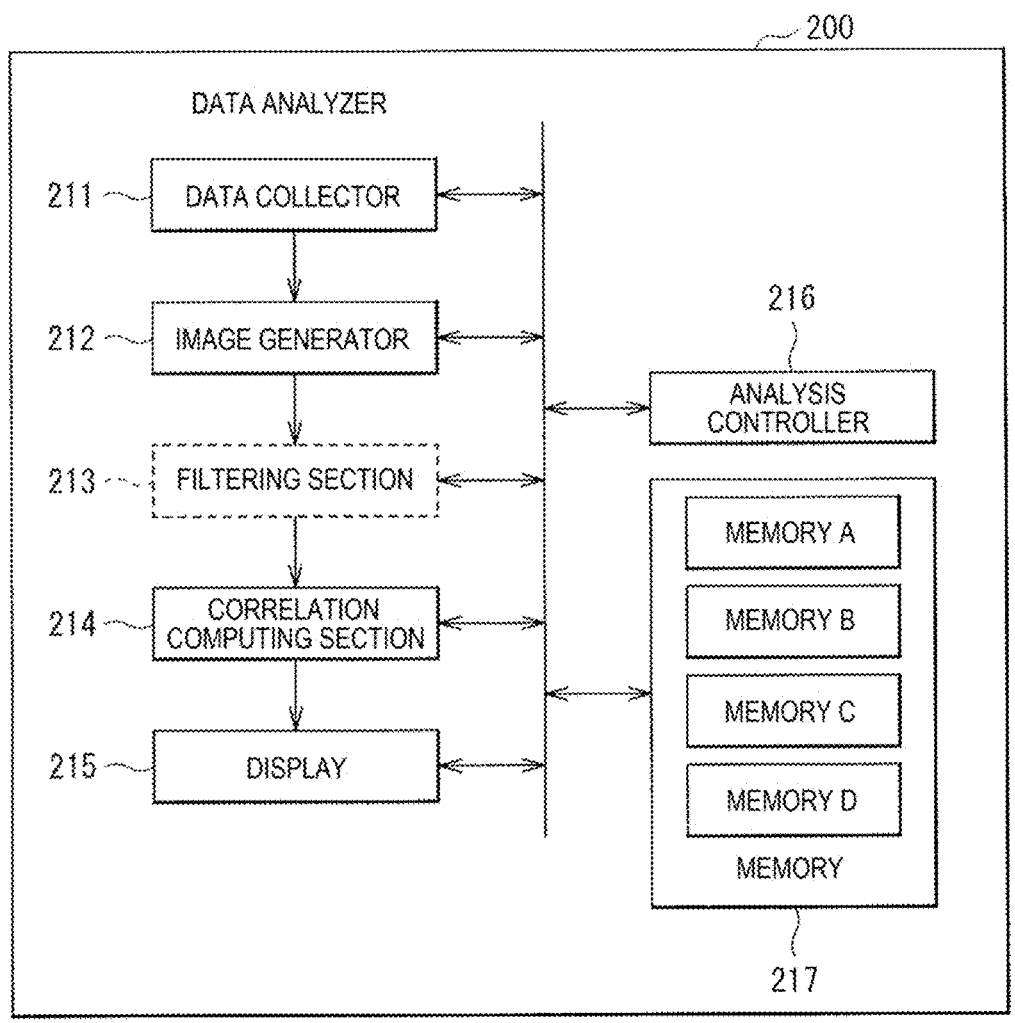
FIG. 7 schematically shows an example of the configuration of a data analyzer according to the first embodiment.

FIG. 7 schematically shows an example of the configuration of the data analyzer 200 according to the first embodiment.

The data analyzer 200 includes a data collector 211, an image generator 212, a filtering section 213, a correlation computing section 214, a display 215, an analysis controller 216, and a memory 217.

The data collector 211 acquires, from each of the plurality of apparatuses including the laser apparatus 1, the exposure apparatus 4, the wafer inspection apparatus 201, and the other manufacturing apparatus 202, data on each analysis target parameter of the apparatus.

The data acquired by the data collector 211 from the laser apparatus 1 is the laser related data Dla described above. The data acquired by the data collector 211 from the exposure apparatus 4 is the exposure condition data Dexp described above. The data acquired by the data collector 211 from the wafer inspection apparatus 201 is the inspection data Dme described above. The data acquired by the data collector 211 from the other manufacturing apparatus 202 is the manufacturing data Dma described above.

The image generator 212 visualizes the data on each of the plurality of parameters collected by the data collector 211 from the plurality of apparatuses that process the wafer for each predetermined area of the wafer to convert the data into an image and generates a plurality of mapped images for each of the parameters of the plurality of apparatuses.

The predetermined area is an area where the exposure apparatus 4 performs a single action of the scanning exposure. The predetermined area may instead be an area obtained by further dividing the area where the scanning exposure is performed into smaller areas.

The image generator 212 generates a mapped image in which differences in data are expressed in grayscales. In this case, the image generator 212 may set a target value of each of the parameters to be the median of the grayscales.

The correlation computing section 214 performs pattern matching on arbitrary ones of the plurality of mapped images generated from the wafer to determine a correlation value between arbitrary ones of the plurality of parameters of the plurality of apparatuses. In this case, the correlation computing section 214 may determine a correlation value between parameters of different apparatuses out of the plurality of apparatuses.

The correlation computing section 214 may output information at least on a set of parameters from which the highest correlation value is derived.

The correlation computing section 214 may output information on a plurality of sets of parameters in descending order of the correlation value.

The display 215 displays the inter-parameter information outputted from the correlation computing section 214. The display 215 may display, for example, the inter-parameter correlation value and the corresponding mapped images.

The filtering section 213 performs digital image filtering on the mapped images generated by the image generator 212. The filtering section 213 may use, for example, a median filter and an averaging filter as the digital image filter.

The memory 217 includes a plurality of memories A, B, C, and D configured to memorize, for example, the mapped images having undergone the digital image filtering performed by the filtering section 213.

[2.2 Operation]

Figure 8:
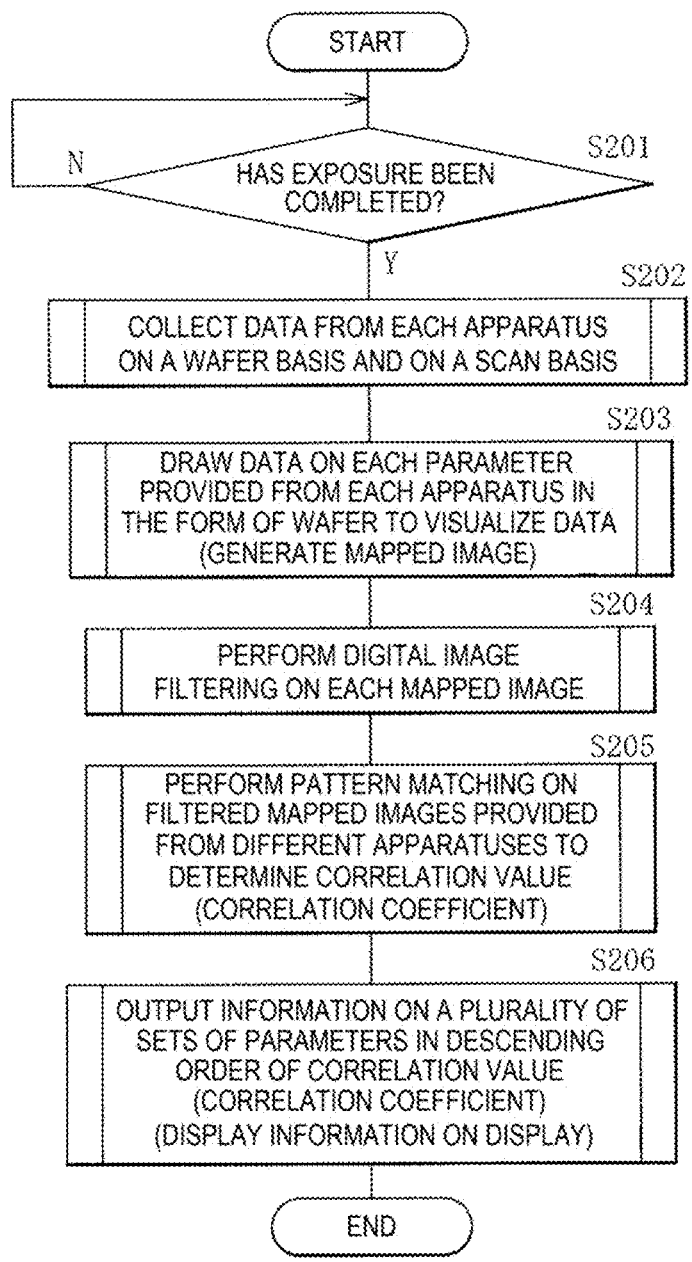
FIG. 8 is a flowchart showing an example of the procedure of analysis performed by the data analyzer according to the first embodiment.

FIG. 8 is a flowchart showing an example of the procedure of analysis performed by the data analyzer 200 according to the first embodiment.

The data analyzer 200 first evaluates whether or not the wafer exposure has been completed (step S201). In a case where the result of the evaluation shows that the exposure has not been completed (N in step S201), the data analyzer 200 repeats the process in step S201.

On the other hand, in a case where the result of the evaluation shows that the exposure has been completed (Y in step S201), the data analyzer 200 then causes the data collector 211 to collect the data from each of the apparatuses on a wafer basis and on a scan basis (step S202).

The data analyzer 200 then causes the image generator 212 to draw the data on each of the parameters provided from each of the apparatuses in the form of the wafer to convert the data into an image (step S203). The image generator 212 thus generates the mapped images.

The data analyzer 200 then causes the filtering section 213 to perform the digital image filtering on the mapped images (step S204).

The data analyzer 200 then causes the correlation computing section 214 to perform pattern matching on filtered mapped images provided from different apparatuses to determine a correlation value (step S205). The correlation value may, for example, be a correlation coefficient representing the degree of correlation and expressed in %.

The data analyzer 200 then causes the correlation computing section 214 to output information on a plurality of sets of parameters in descending order of the correlation value (step S206) and terminates the entire process. The destination to which the information is outputted is the display 215. Specifically, the data analyzer 200 displays the information on a plurality of sets of parameters on the display 215, for example, as shown in FIGS. 22 and 23, which will be described later.

Figure 9:
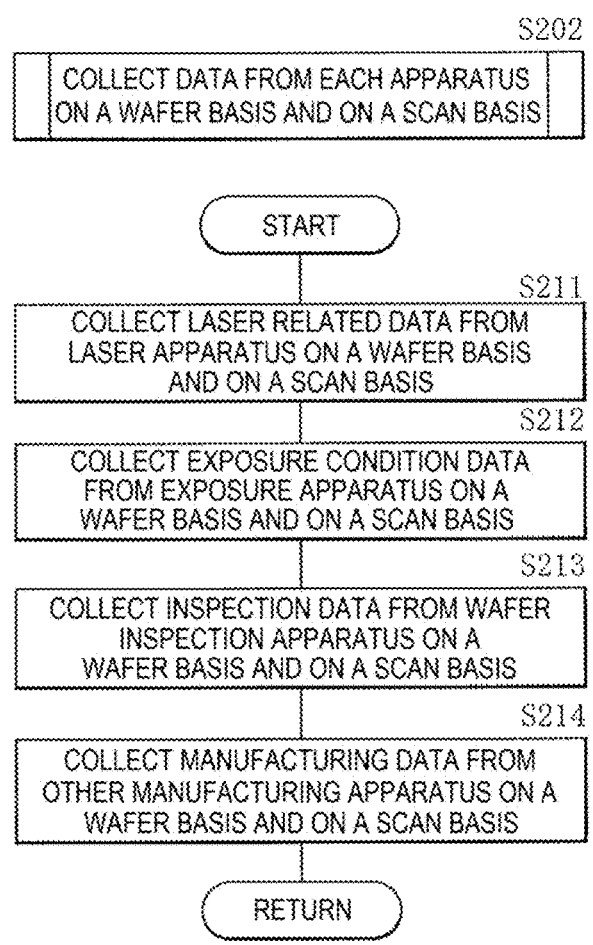
FIG. 9 is a sub-flowchart showing in detail the processes in step S202 in the flowchart shown in FIG. 8.

FIG. 9 is a sub-flowchart showing in detail the processes in step S202 in the flowchart shown in FIG. 8.

The data analyzer 200 first causes the data collector 211 to collect the laser related data Dla from the laser apparatus 1 on a wafer basis and on a scan basis (step S211).

The data analyzer 200 then causes the data collector 211 to collect the exposure condition data Dexp from the exposure apparatus 4 on a wafer basis and on a scan basis (step S212).

The data analyzer 200 then causes the data collector 211 to collect the inspection data Dme from the wafer inspection apparatus 201 on a wafer basis and on a scan basis (step S213).

The data analyzer 200 then causes the data collector 211 to collect the manufacturing data Dma from the other manufacturing apparatus 202 on a wafer basis and on a scan basis (step S214). The data analyzer 200 then terminates the processes in step S202, returns to the main routine in FIG. 8, and carries out the processes in step S203 in FIG. 8.

Figure 10:
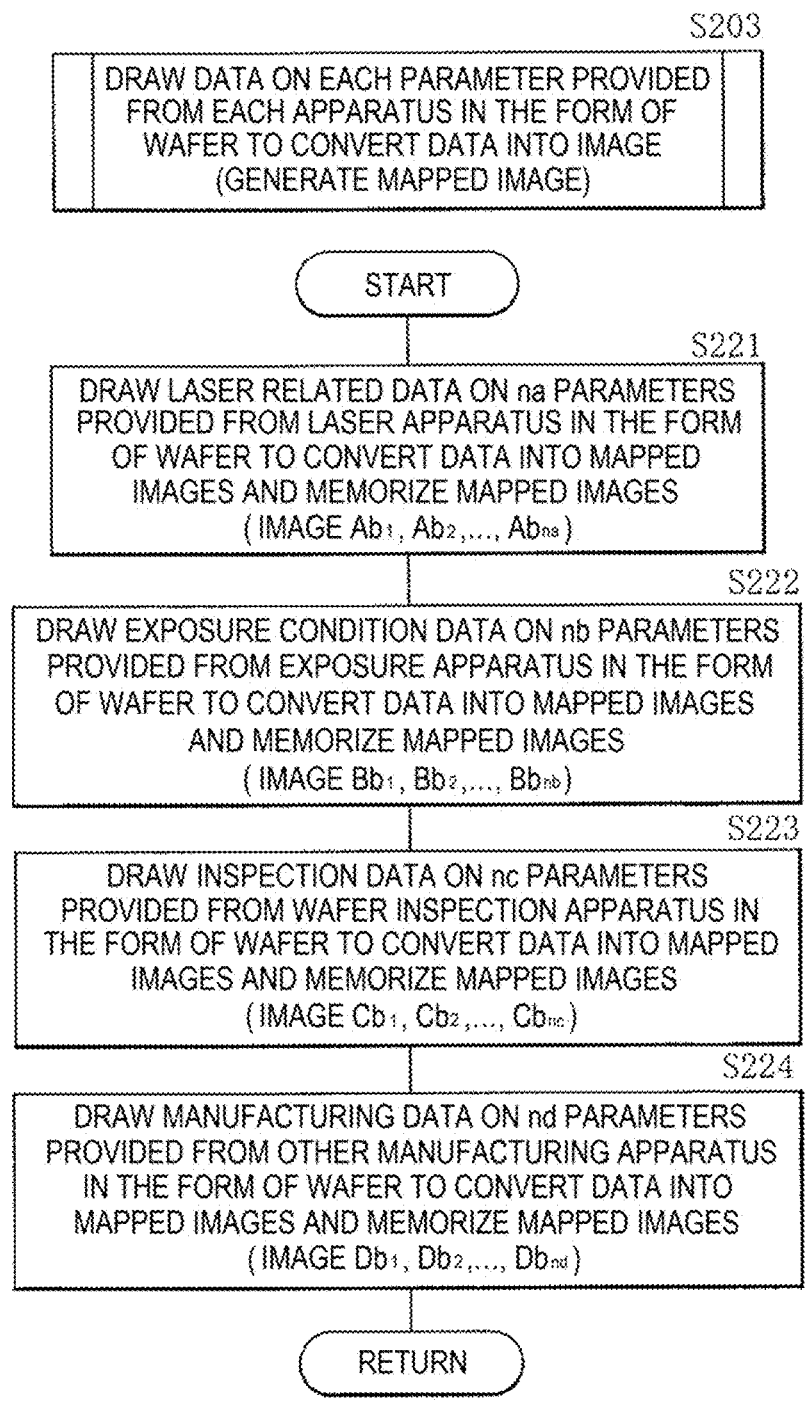
FIG. 10 is a sub-flowchart showing in detail the processes in step S203 in the flowchart shown in FIG. 8.

FIG. 10 is a sub-flowchart showing in detail the processes in step S203 in the flowchart shown in FIG. 8.

The data analyzer 200 first causes the image generator 212 to draw the laser related data Dla on na parameters provided from the laser apparatus 1 in the form of the wafer to convert the data into mapped images and memorizes the mapped images as an image $Ab_1$, an image $Ab_2$, ..., an image $Ab_{na}$ in the memory 217 (step S221).

The data analyzer 200 then causes the image generator 212 to draw the exposure condition data Dexp on nb parameters provided from the exposure apparatus 4 in the form of the wafer to convert the data into mapped images and memorizes the mapped images as an image $Bb_1$, an image $Bb_2$, ..., an image $Bb_{nb}$ in the memory 217 (step S222).

The data analyzer 200 then causes the image generator 212 to draw the inspection data Dme on nc parameters provided from the wafer inspection apparatus 201 in the form of the wafer to convert the data into mapped images and memorizes the mapped images as an image $Cb_1$, an image $Cb_2$, ..., an image $Cb_{nc}$ in the memory 217 (step S223).

The data analyzer 200 then causes the image generator 212 to draw the manufacturing data Dma on nd parameters provided from the other manufacturing apparatus 202 in the form of the wafer to convert the data into mapped images and memorizes the mapped images as an image $db_1$, an image $db_2$, ..., an image $db_{nd}$ in the memory 217 (step S224). The data analyzer 200 then terminates the processes in step S203, returns to the main routine in FIG. 8, and carries out the processes in step S204 in FIG. 8.

Figure 11:
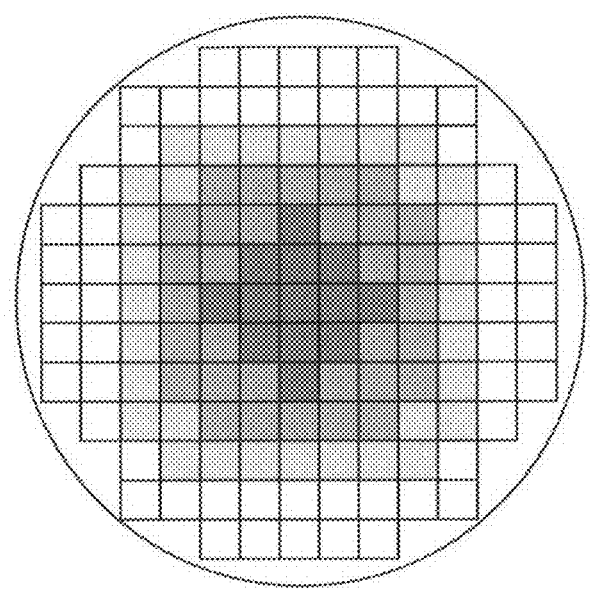
FIG. 11 schematically shows an example of a mapped image.

FIG. 11 schematically shows an example of the mapped images generated by the image generator 212.

The mapped image shown in FIG. 11 is an example of the result of data/image conversion operation of drawing data on a single arbitrary parameter obtained, for example, when the wafer exposure is performed on the first wafer (Wafer #1).

Figure 12:
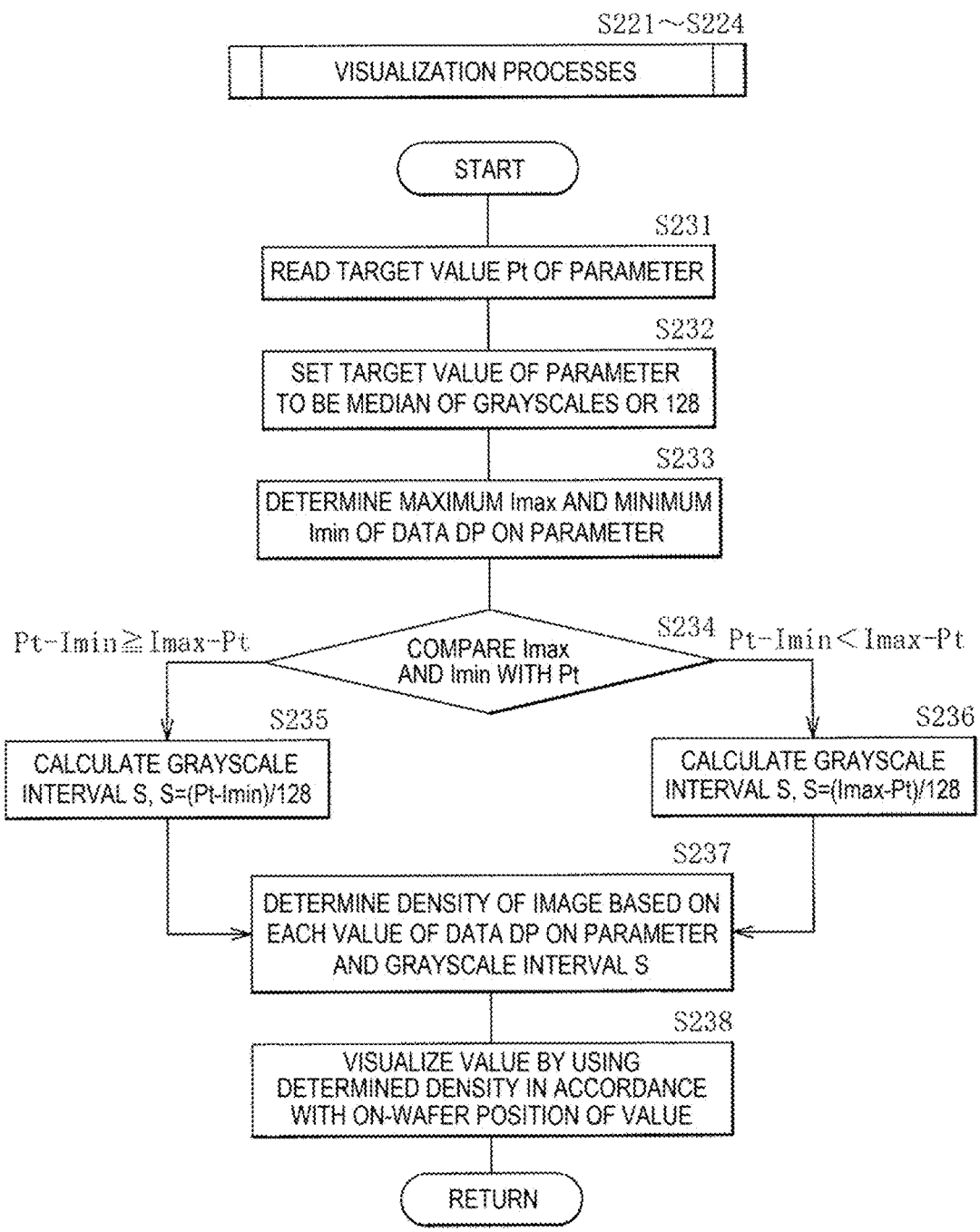
FIG. 12 is a flowchart showing a specific example of data/image conversion processes in steps S221 to S224 in the flowchart shown in FIG. 10.

FIG. 12 is a flowchart showing a specific example of the data/image conversion processes in steps S221 to S224 in the flowchart shown in FIG. 10.

The image generator 212 first reads a target value Pt of a parameter (step S231). The target value Pt of a parameter is acquired in advance from the corresponding apparatus and memorized in the memory 217 of the data analyzer 200. The target value Pt of a parameter may, for example, be a value of the target spectral linewidth Δλtb.

The image generator 212 then sets the target value of a parameter to be the median of the grayscales (step S232). For example, provided that the grayscales are expressed by 256 steps, the image generator 212 sets the target value of the target spectral linewidth Δλtb at 128, which is the median of the grayscales.

The image generator 212 then determines a maximum Imax and a minimum Imin of data DP on the parameter (step S233).

The image generator 212 then compares the maximum Imax and the minimum Imin with the target value Pt (step S234).

In a case where Pt−Imin≥Imax−Pt, the image generator 212 calculates a grayscale interval S based on the following expression (step S235):

$$S=(Pt-I\min)/128$$

On the other hand, in a case where Pt−Imin<Imax−Pt, the image generator 212 calculates the grayscale interval S based on the following expression (step S236):

$$S=(I\max-Pt)/128$$

Having calculated the grayscale interval S in step S235 or S236, the image generator 212 determines the density of the image based on each value of the data DP on a parameter and the grayscale interval S (step S237).

The image generator 212 then converts the value of the data by using the determined density into an image in accordance with the on-wafer position of the value (step S238).

Figure 13:
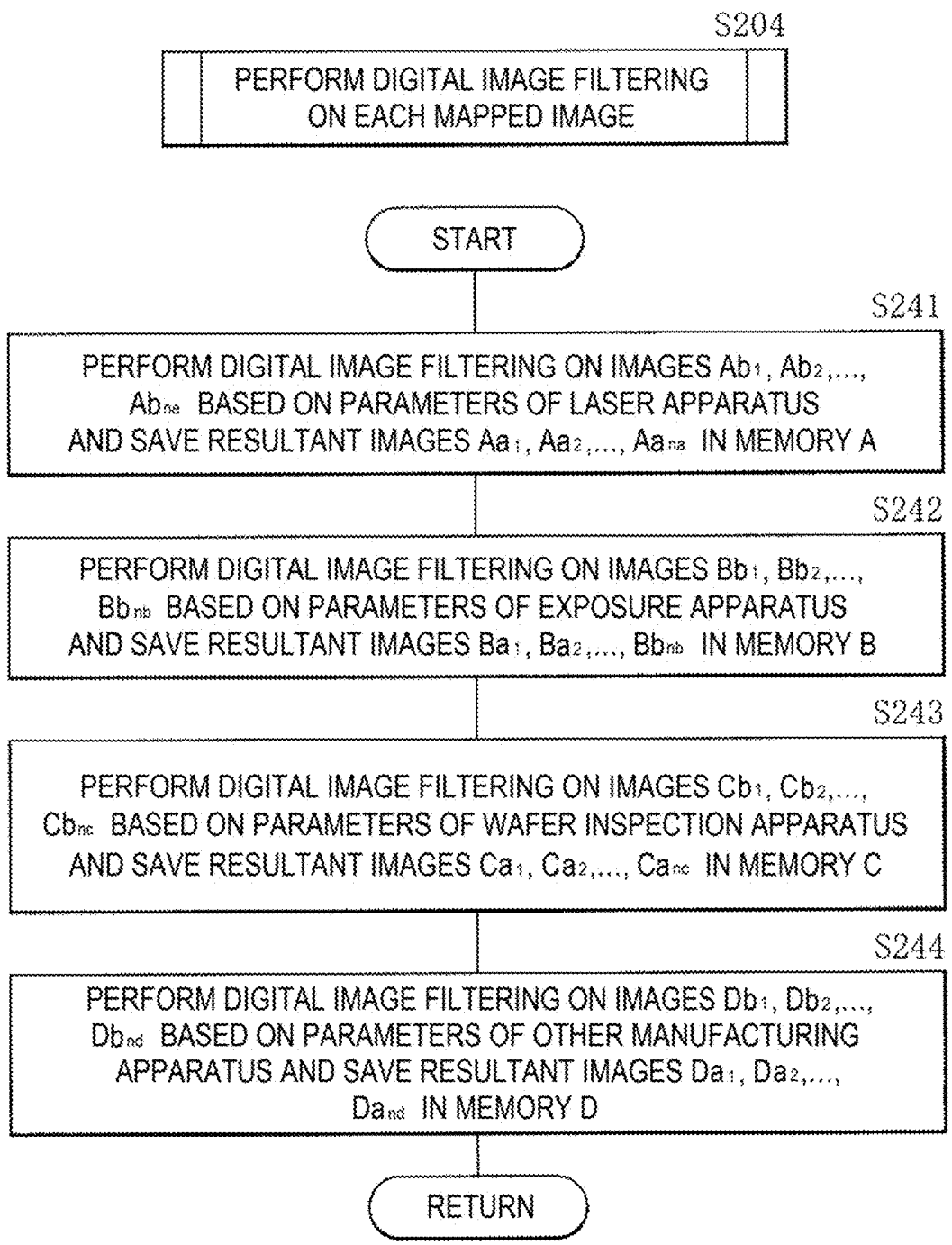
FIG. 13 is a sub-flowchart showing in detail the processes in step S204 in the flowchart shown in FIG. 8.

FIG. 13 is a sub-flowchart showing in detail the processes in step S204 in the flowchart shown in FIG. 8.

The data analyzer 200 first causes the filtering section 213 to perform the digital image filtering on the images $Ab_1$, $Ab_2$, ..., $Ab_{na}$ based on the parameters of the laser apparatus 1 and saves the resultant images $Aa_1$, $Aa_2$, ..., $Aa_{na}$ in the memory A of the memory 217 (step S241).

The data analyzer 200 then causes the filtering section 213 to perform the digital image filtering on the images $Bb_1$, $Bb_2$, ..., $Bb_{nb}$ based on the parameters of the exposure apparatus 4 and saves the resultant images $Ba_1$, $Ba_2$, ..., $Ba_{nb}$ in the memory B of the memory 217 (step S242).

The data analyzer 200 then causes the filtering section 213 to perform the digital image filtering on the images $Cb_1$, $Cb_2$, ..., $Cb_{nc}$ based on the parameters of the wafer inspection apparatus 201 and saves the resultant images $Ca_1$, $Ca_2$, ..., $Ca_{nc}$ in the memory C of the memory 217 (step S243).

The data analyzer 200 then causes the filtering section 213 to perform the digital image filtering on the images $db_1$, $db_2$, ..., $db_{nd}$ based on the parameters of the other manufacturing apparatus 202 and saves the resultant images $Da_1$, $Da_2$, ..., $Da_{nd}$ in the memory D of the memory 217 (step S244). The data analyzer 200 then terminates the processes in step S204, returns to the main routine in FIG. 8, and carries out the processes in step S205 in FIG. 8.

FIG. 14 schematically shows an example of the mapped images having undergone the digital image filtering performed by the filtering section 213.

FIG. 14 shows an example of a mapped image Aa resulting from the digital image filtering performed on a mapped image Ab produced, for example, after the wafer exposure is performed on the first wafer (Wafer #1).

Figure 15:
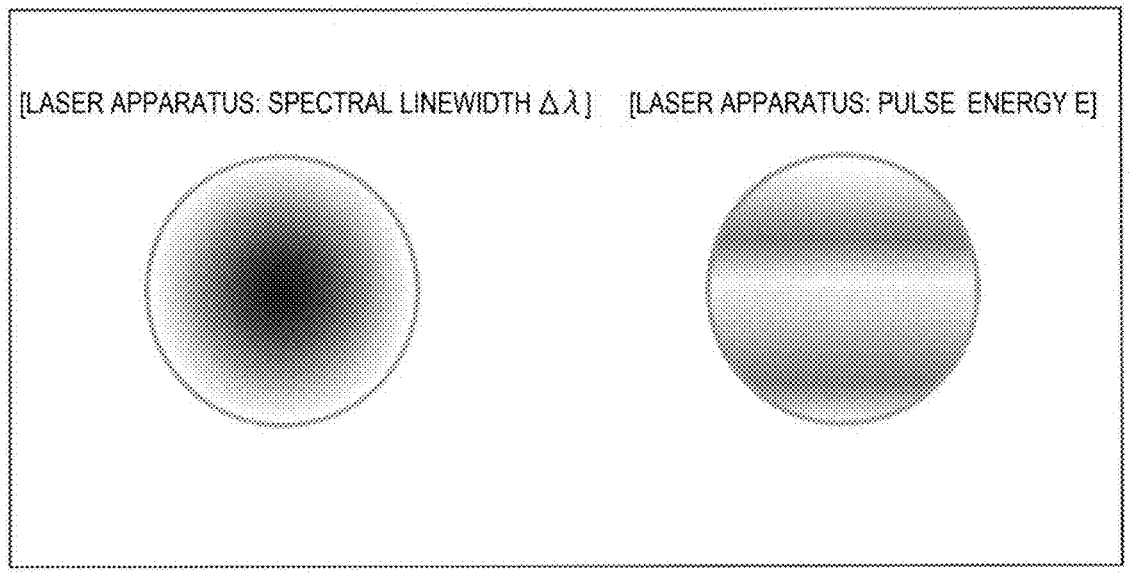
FIG. 15 schematically shows examples of digital-image-filtered, mapped images generated based on parameters of a laser apparatus.
Figure 16:
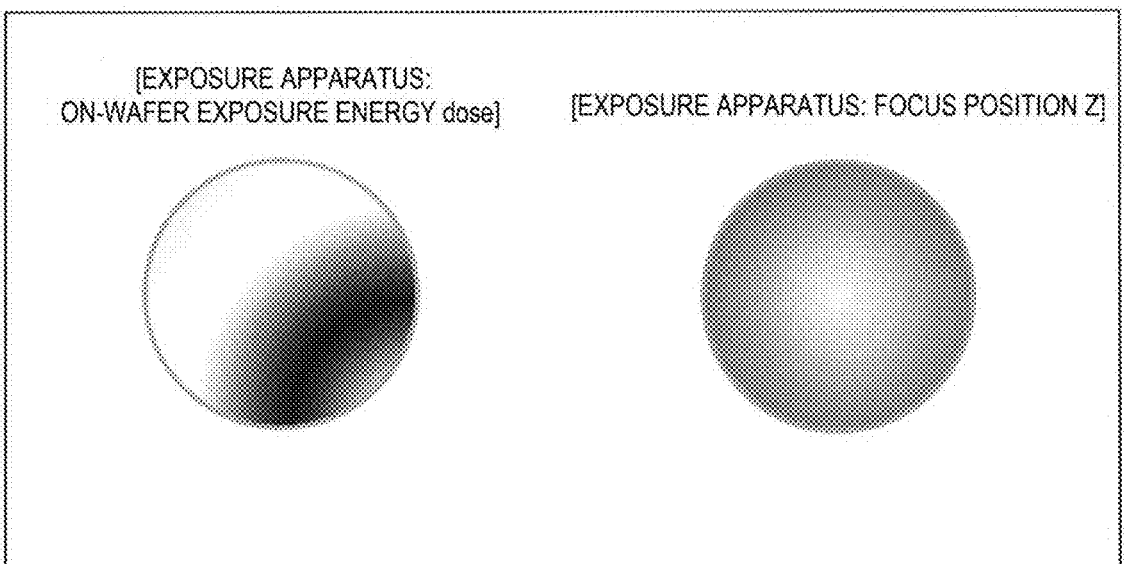
FIG. 16 schematically shows examples of digital-image-filtered, mapped images generated based on parameters of an exposure apparatus.
Figure 17:
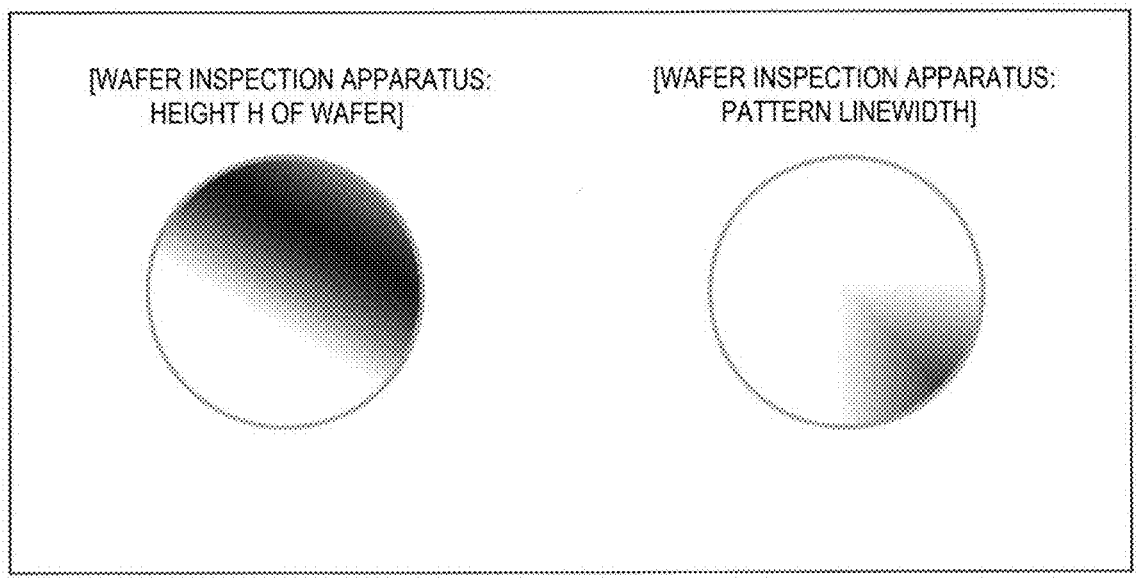
FIG. 17 schematically shows examples of digital-image-filtered, mapped images generated based on parameters of a wafer inspection apparatus.

FIGS. 15, 16, and 17 each show specific examples of images having undergone the digital image filtering performed by the filtering section 213 based on data on the parameters of the apparatuses. The digital image filtering performed by the filtering section 213 may be the process of reversing the grayscales of an image to generate a reversed image.

FIG. 15 schematically shows examples of digital-image-filtered, mapped images generated based on the parameters of the laser apparatus 1.

FIG. 15 shows by way of example a mapped image relating to the spectral linewidth $\Delta\lambda$ and a mapped image relating to the pulse energy E.

FIG. 16 schematically shows examples of digital-image-filtered, mapped images generated based on the parameters of the exposure apparatus 4.

FIG. 16 shows by way of example a mapped image relating to exposed energy "dose" on the wafer and a mapped image relating to the focus position Z where the wafer is brought into focus in the direction Z.

FIG. 17 schematically shows examples of digital-image-filtered, mapped images generated based on the parameters of the wafer inspection apparatus 201.

FIG. 17 shows by way of example a mapped image relating to a height H of the wafer and a mapped image relating to a pattern linewidth.

Figure 18:
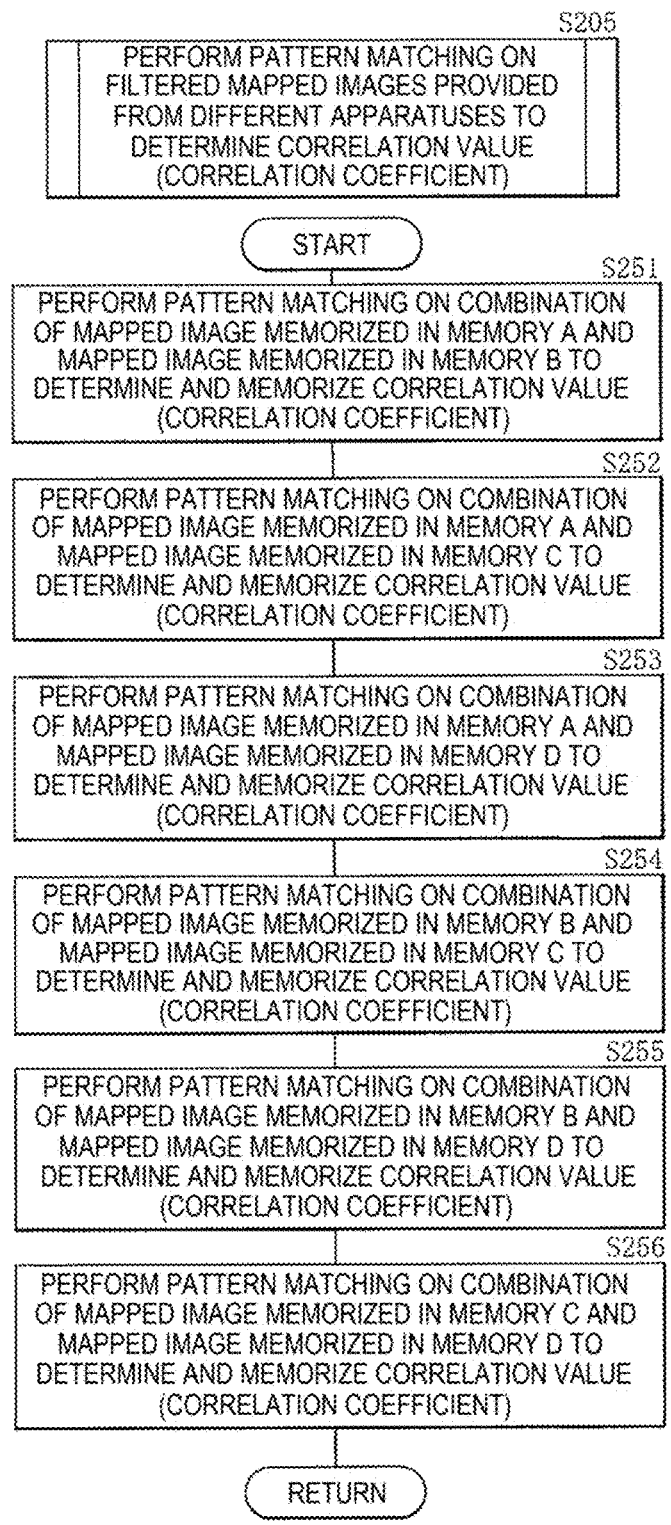
FIG. 18 is a sub-flowchart showing in detail the processes in step S205 in the flowchart shown in FIG. 8.

FIG. 18 is a sub-flowchart showing in detail the processes in step S205 in the flowchart shown in FIG. 8.

The data analyzer 200 first causes the correlation computing section 214 to perform pattern matching on the combination of a mapped image memorized in the memory A and a mapped image memorized in the memory B to determine a correlation coefficient as the correlation value and memorizes the correlation coefficient (step S251).

The data analyzer 200 then causes the correlation computing section 214 to perform pattern matching on the combination of a mapped image memorized in the memory A and a mapped image memorized in the memory C to determine a correlation coefficient as the correlation value and memorizes the correlation coefficient (step S252).

The data analyzer 200 then causes the correlation computing section 214 to perform pattern matching on the combination of a mapped image memorized in the memory A and a mapped image memorized in the memory D to determine a correlation coefficient as the correlation value and memorizes the correlation coefficient (step S253).

The data analyzer 200 then causes the correlation computing section 214 to perform pattern matching on the combination of a mapped image memorized in the memory B and a mapped image memorized in the memory C to determine a correlation coefficient as the correlation value and memorizes the correlation coefficient (step S254).

The data analyzer 200 then causes the correlation computing section 214 to perform pattern matching on the combination of a mapped image memorized in the memory B and a mapped image memorized in the memory D to determine a correlation coefficient as the correlation value and memorizes the correlation coefficient (step S255).

The data analyzer 200 then causes the correlation computing section 214 to perform pattern matching on the combination of a mapped image memorized in the memory C and a mapped image memorized in the memory D to determine a correlation coefficient as the correlation value and memorizes the correlation coefficient (step S256). The data analyzer 200 then completes the processes in step S205, returns to the main routine in FIG. 8, and then carries out the processes in step S206 in FIG. 8.

FIGS. 19 and 20 show an example of the combinations of mapped images provided by the processes in FIG. 18 and an example of the correlation coefficients corresponding to the combinations. In particular, FIG. 20 shows an example of the combinations of mapped images including a reversed mapped image and an example of correlation coefficients corresponding to the combinations.

FIG. 21 is a sub-flowchart showing in detail the processes in step S206 in the flowchart shown in FIG. 8.

The data analyzer 200 first displays a list of the combination information and the correlation coefficient in descending order of the combination's correlation coefficient on the display 215 (step S261). FIG. 22 shows an example of the list outputted as information on the parameters. The displayed contents of the list may be changeable in accordance with a request from a user of the data analyzer 200. For example, the order of the combinations displayed in the list may be changeable in accordance with the user's request. Further, the contents of the combinations displayed in the list may be selectable by the user. Moreover, the number of combinations displayed in the list may be changeable in accordance with the user's request.

The data analyzer 200 then displays, in descending order of the combination's correlation coefficient, the mapped images of the combination and the correlation coefficient on the display 215 (step S262). FIG. 23 shows an example of the mapped images and the correlation coefficient outputted as information on the parameters. The displayed contents of the mapped images and the correlation coefficient may be changeable in accordance with a request from the user of the data analyzer 200. For example, the order of the displayed combinations may be changeable in accordance with the user's request. Further, the contents of the displayed combinations may be selectable by the user. Moreover, the number of displayed combinations may be changeable in accordance with the user's request.

[2.3 Advantages/Effects]

The data analyzer 200 and the semiconductor manufacturing system according to the first embodiment can convert data for each of the analysis target parameters obtained from a plurality of apparatuses, such as the laser apparatus 1 and the exposure apparatus 4, into an image and perform pattern matching on arbitrary ones of a plurality of mapped images to determine a correlation value between arbitrary parameters. Information on a plurality of sets of parameters of the plurality of apparatuses can thus be displayed, for example, in descending order of the correlation among the parameters. As a result, at a manufacturing site, parameters highly correlated to each other allow a problem with the plurality of apparatuses to be readily grasped, whereby the quality of a product can be efficiently improved.

[2.4 Variations]

The above description has been made with reference to the case where a plurality of apparatuses including the laser apparatus 1, the exposure apparatus 4, the wafer inspection apparatus 201, and the other manufacturing apparatus 202 are directly connected to the data analyzer 200, but not necessarily, and the plurality of apparatuses may be connected to the data analyzer 200 via a server. In this case, the server may receive data on each analysis target parameter from each of the apparatuses and temporarily save the data. The data analyzer 200 may acquire data on each analysis target parameter provided from each of the apparatuses and saved in the server from the server for analysis.

In the above description, the correlation computing section 214 determines a correlation value between parameters of different ones of the plurality of apparatuses in step S205 in FIG. 8. The data analyzer 200 may further determine a correlation value between parameters of the one of the plurality of apparatuses.

A set of parameters of one of the plurality of apparatuses may be parameters measured, for example, with the spectrum measurer 34 and the beam measurer 40 in the laser apparatus 1. The parameters may instead be a parameter measured with the pulse energy measurer 33 and a parameter, such as gas pressure P and the charging voltage V in the laser apparatus 1.

A correlation value between parameters not only in the laser apparatus 1 but in the exposure apparatus 4 and the other manufacturing apparatus 202 may be determined.

Figures 24, 25:
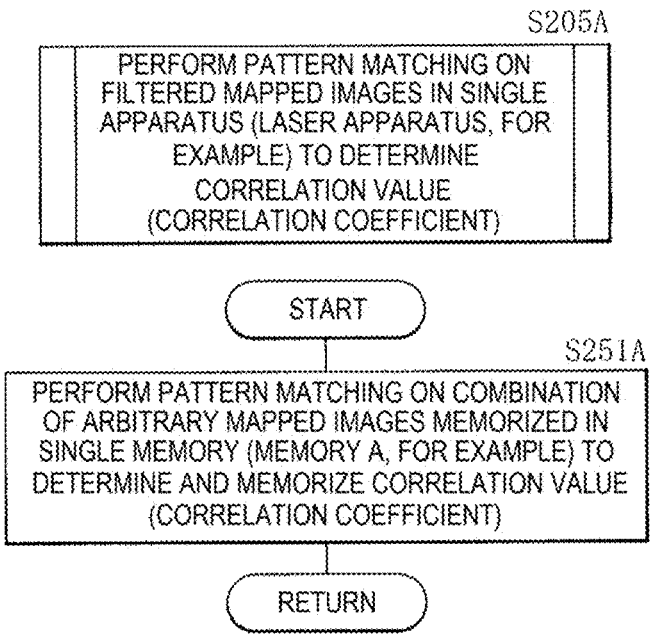
FIG. 24 is a flowchart showing an example of a process added as a variation of the flowchart shown in FIG. 8.
FIG. 25 schematically shows an example of the combinations of mapped images and an example of the correlation coefficients corresponding to the combinations determined by the process in the variation in FIG. 24.

FIG. 24 is a flowchart showing an example of a process added as a variation of the flowchart shown in FIG. 8. FIG. 25 schematically shows an example of the combinations of mapped images and an example of the correlation coefficients corresponding to the combinations determined by the process in the variation in FIG. 24.

The processes in step S205 in FIG. 8 may be followed by the process in step S205A in FIG. 24. The process in step S205A may include the process in step S251A as a subroutine.

The data analyzer 200 may cause the correlation computing section 214 to perform pattern matching on filtered mapped images in a single apparatus, for example, in the laser apparatus 1 to determine a correlation coefficient as the correlation value (step S205A).

In this case, the data analyzer 200 may cause the correlation computing section 214 to perform pattern matching on the combination of arbitrary mapped images memorized in a single memory, for example, in the memory A to determine a correlation coefficient as the correlation value and may memorize the correlation coefficient (step S251A).

<3. Second Embodiment> (Data Analyzer Having Parameter Feedback Control Function and Semiconductor Manufacturing System)

A data analyzer and a semiconductor manufacturing system according to a second embodiment of the present disclosure will next be described. In the following description, substantially the same portions as the components of the laser apparatus and the laser apparatus managing system according to Comparative Example described above or the data analyzer and the semiconductor manufacturing system according to the first embodiment have the same reference characters and will not be described as appropriate.

[3.1 Configuration]

Figure 26:
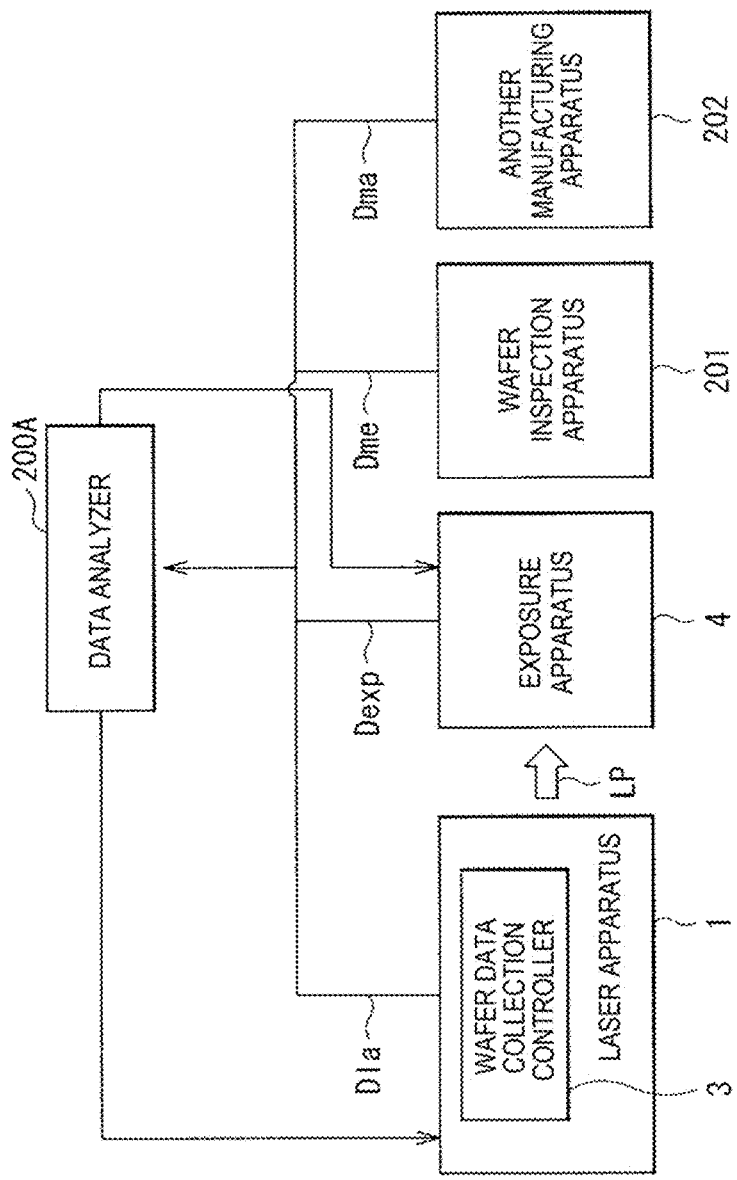
FIG. 26 schematically shows an example of the configuration of a semiconductor manufacturing system according to a second embodiment

FIG. 26 schematically shows an example of the configuration of the semiconductor manufacturing system according to the second embodiment.

The semiconductor manufacturing system according to the second embodiment differs from the semiconductor manufacturing system according to the first embodiment in that it includes a data analyzer 200A. The data analyzer 200A includes substantially the same components as those of the data analyzer 200 in FIG. 7.

The data analyzer 200A performs feedback control on the control parameters based on data produced by analysis of the apparatus. To perform the feedback control, for example, a signal line configured to transmit data for updating the control parameters from the data analyzer 200A to the laser apparatus 1 is provided between the data analyzer 200A and the laser apparatus 1. A signal line configured to transmit data for updating the control parameters from the data analyzer 200A to the exposure apparatus 4 may be provided between the data analyzer 200A and the exposure apparatus 4.

In the data analyzer 200A, the analysis controller 216 in FIG. 7 is a controller configured to change a parameter relating to control of at least one apparatus out of the plurality of apparatuses based on a correlation value between parameters. The analysis controller 216 is configured to change a parameter relating to the control of at least one apparatus based on the result of wafer inspection performed by the wafer inspection apparatus 201.

The other configurations are substantially the same as those of the data analyzer 200 and the semiconductor manufacturing system according to the first embodiment described above.

[3.2 Operation]

Figure 27:
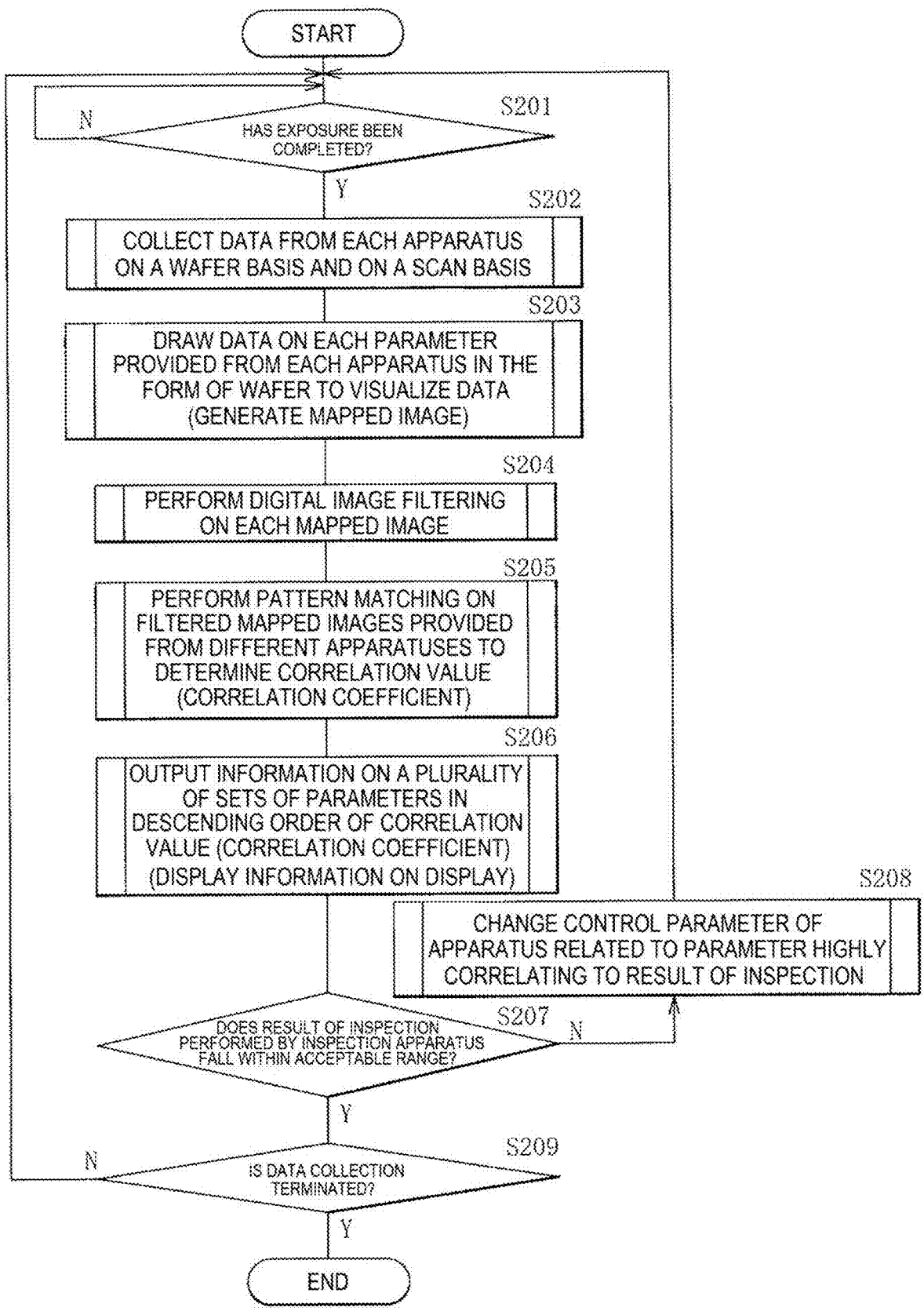
FIG. 27 is a flowchart showing an example of the procedure of analysis performed by a data analyzer according to the second embodiment.

FIG. 27 is a flowchart showing an example of the procedure of analysis performed by the data analyzer 200A according to the second embodiment.

The data analyzer 200A first carries out substantially the same processes as those in steps S201 to S206 in FIG. 8. The data analyzer 200A then evaluates whether or not the result of inspection performed by the wafer inspection apparatus 201 falls within an acceptable range (step S207).

In a case where the result of the evaluation shows that the result of the inspection does not fall within the acceptable range (N in step S207), the data analyzer 200A cause the analysis controller 216 in FIG. 7 to change a control parameter of an apparatus related to a parameter highly correlating to the result of the inspection (step S208) and returns to the process in step S201.

In a case where the result of the evaluation shows that the result of the inspection falls within the acceptable range (Y in step S207), the data analyzer 200A then evaluates whether or not the data collection process is terminated (step S209). In a case where the result of the evaluation shows that the data collection process is not terminated (N in step S209), the data analyzer 200A returns to the process in step S201. In a case where the result of the evaluation shows that the data collection process is terminated (Y in step S209), the data analyzer 200A terminates the entire process.

Figure 28:
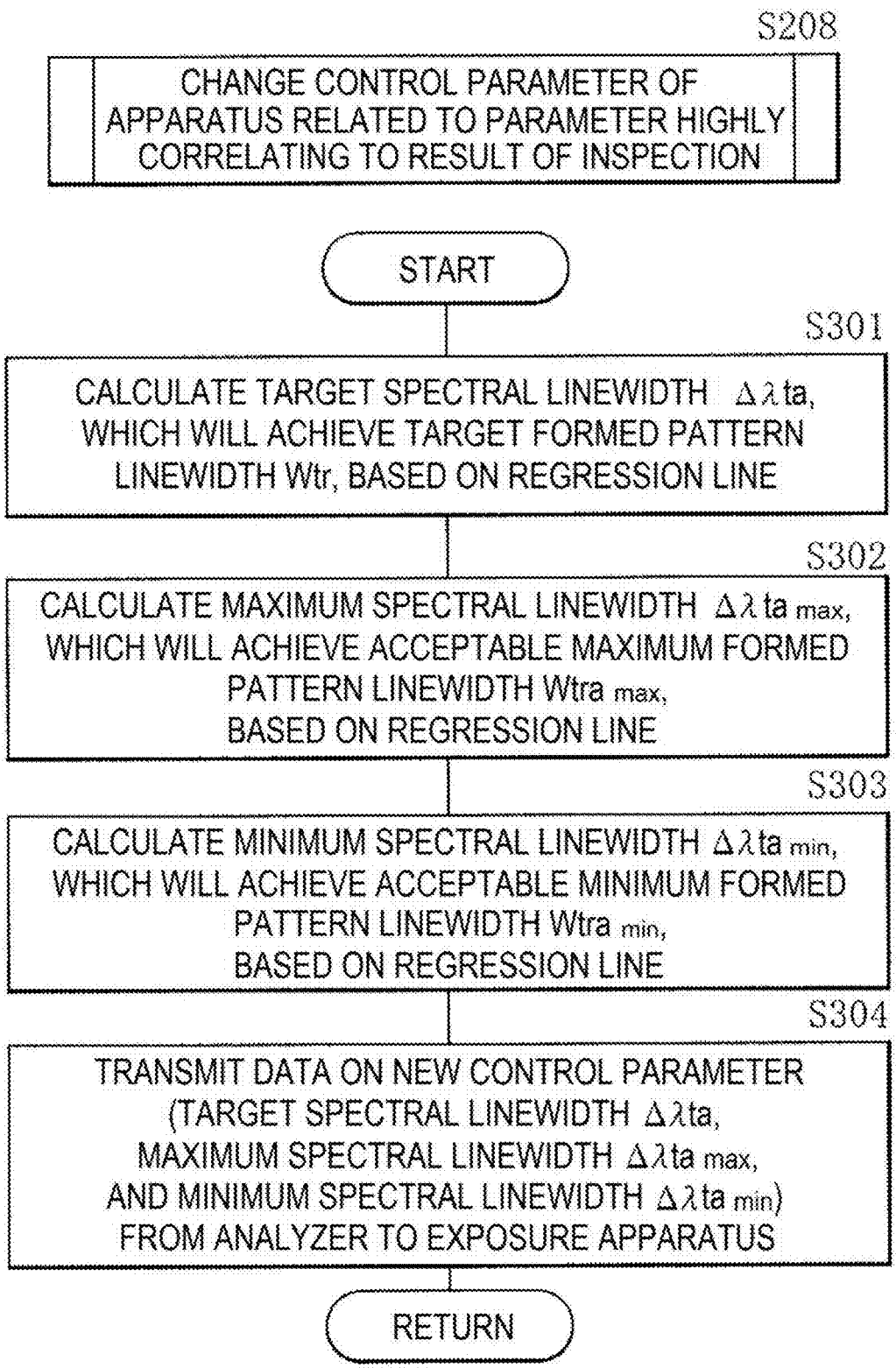
FIG. 28 is a sub-flowchart showing in detail the processes in step S208 in the flowchart shown in FIG. 27.
Figure 29:
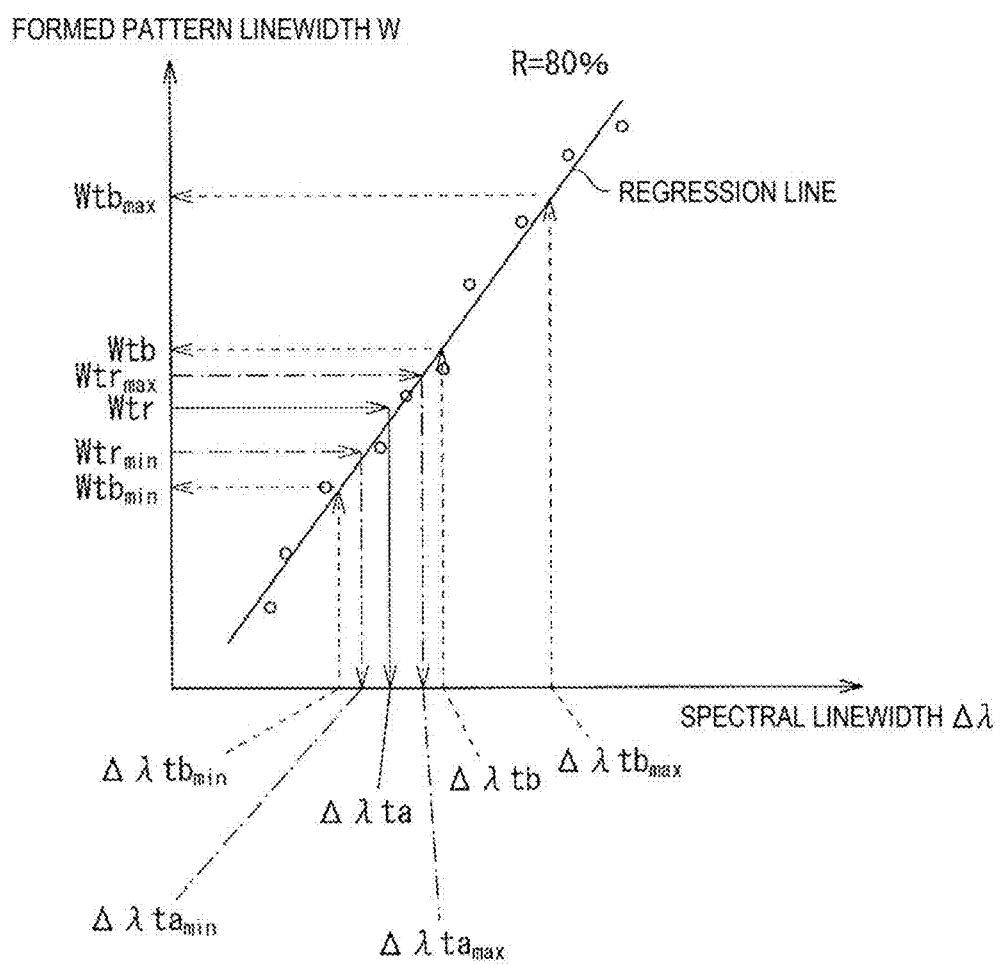
FIG. 29 schematically shows an example of a regression line relating to a spectral linewidth $\Delta\lambda$ and a formed pattern linewidth W.

FIG. 28 is a sub-flowchart showing in detail the processes in step S208 in the flowchart shown in FIG. 27. FIG. 29 schematically shows an example of a regression line relating to the spectral linewidth $\Delta\lambda$ and a formed pattern linewidth W.

In FIG. 28, it is assumed as a specific example of the processes in step S208 in FIG. 27, for example, that the correlation between the spectral linewidth $\Delta\lambda$ in the laser apparatus 1 and the formed pattern linewidth W in the wafer inspection apparatus 201 is the highest, as shown in FIG. 23.

The following parameters are now defined in FIG. 29:

$\Delta\lambda$tb: target spectral linewidth set first $\Delta\lambda$tb$_{max}$: maximum spectral linewidth set first $\Delta\lambda$tb$_{min}$ minimum spectral linewidth set first Wtb: target formed pattern linewidth corresponding to $\Delta\lambda$tb determined from regression line Wtb$_{max}$: formed pattern linewidth corresponding to $\Delta\lambda$tb$_{max}$ determined from regression line Wtb$_{min}$: formed pattern linewidth corresponding to $\Delta\lambda$tb$_{min}$ determined from regression line To allow the formed pattern linewidth W to fall within an acceptable range close to the target formed pattern linewidth Wtb based on the regression line in FIG. 29, the target spectral linewidth $\Delta\lambda$tb and the range of the spectral linewidth need to be changed. The range of the spectral linewidth is the range between the maximum spectral linewidth $\Delta\lambda$tb$_{max}$ and the minimum spectral linewidth $\Delta\lambda$tb$_{min}$.

The analysis controller 216 first calculates a target spectral linewidth $\Delta\lambda$ta, which will achieve a target formed pattern linewidth Wtr, based on the regression line (step S301).

The analysis controller 216 then calculates a maximum spectral linewidth $\Delta\lambda$ta$_{max}$, which will achieve an acceptable maximum formed pattern linewidth Wtr$_{max}$, based on the regression line (step S302).

The analysis controller 216 then calculates a minimum spectral linewidth $\Delta\lambda$ta$_{mm}$, which will achieve an acceptable minimum formed pattern linewidth Wtr$_{min}$, based on the regression line (step S303).

The analysis controller 216 then transmits data on a new control parameter to the exposure apparatus 4 (step S304). The new control parameter is formed of the target spectral linewidth $\Delta\lambda$ta, the maximum spectral linewidth $\Delta\lambda$ta$_{max}$, and the minimum spectral linewidth $\Delta\lambda$ta$_{min}$.

The exposure apparatus 4 transmits data for updating the control parameter received from the data analyzer 200A to the laser apparatus 1. The laser apparatus 1 controls the spectral linewidth $\Delta\lambda$ in such a way that the spectral linewidth $\Delta\lambda$ falls within the updated data range. As a result, the formed pattern linewidth W becomes a formed pattern linewidth W that falls within the acceptable range having a median equal to the target formed pattern linewidth Wtb. In this example, the data analyzer 200A transmits data for updating the control parameter of the laser apparatus 1 via the exposure apparatus 4, but not necessarily, and the data analyzer 200A may transmit the data for updating the control parameter of the laser apparatus 1 directly to the laser apparatus 1.

The other operations are substantially the same as those of the data analyzer 200 and the semiconductor manufacturing system according to the first embodiment described above.

[3.3 Advantages/Effects]

According to the laser apparatus 1 and the laser apparatus managing system according to the second embodiment, the data analyzer 200A selects a highly correlative parameter combination and transmits a feedback signal, for example, to the laser apparatus 1 or the exposure apparatus 4 in such a way that the parameter is controlled with precision, thus improving the quality of a wafer.

(Others)

In the above description, the data analyzer 200A transmits a feedback signal to the laser apparatus 1 or the exposure apparatus 4, but not necessarily. For example, a highly correlative parameter may be selected, and a control parameter that is associated with the laser apparatus 1 or the exposure apparatus 4 and is capable of controlling the selected parameter with precision may be displayed on the display 215. As a result, an operator may evaluate the displayed content and transmit data for updating the control parameter to the laser apparatus 1 or the exposure apparatus 4.

The other advantages and effects are substantially the same as those of the data analyzer 200 and the semiconductor manufacturing system according to the first embodiment described above.

4. Others

The above description is intended not to be limiting but merely to be exemplary. It will therefore be apparent for a person skilled in the art that the embodiments of the present disclosure can be changed without departing from the accompanying claims.

The terms used in the entire specification and accompanying claims should each be construed as a "non-limiting" term. For example, the term "include" or "included" should be construed as "does not necessarily include only what is described." The term "have" should be construed as "does not necessarily have only what is described." Further, an indefinite article "a" described in the present specification and the accompanying claims should be construed as a term that means "at least one" or "one or more."

What is claimed is:

1. A data analyzer comprising:

a data collector configured to acquire data on each analysis target parameter of each of a plurality of apparatuses from the apparatus, the plurality of apparatuses including a light source apparatus, an exposure apparatus configured to expose a wafer to pulsed light outputted from the light source apparatus, and a wafer inspection apparatus configured to inspect the wafer exposed by the exposure apparatus;

an image generator configured to visualize the data on each of the plurality of parameters collected by the data collector from the plurality of apparatuses that process the wafer for each predetermined area of the wafer to convert the data into an image and generate a plurality of mapped images for each of the parameters of the plurality of apparatuses; and a correlation computing section configured to perform pattern matching on arbitrary mapped images out of the plurality of mapped images generated from the wafer to determine a correlation value between arbitrary parameters out of the plurality of parameters of the plurality of apparatuses, wherein the image generator is configured to generate a mapped image in which differences in data are expressed in grayscales, and the image generator sets a target value of each of the parameters to be a median of the grayscales.

2. The data analyzer according to claim 1, wherein the correlation computing section outputs at least information on a set of parameters from which a largest correlation value has been derived.

3. The data analyzer according to claim 2, wherein the correlation computing section outputs information on a plurality of sets of parameters in a descending order of the correlation value.

4. The data analyzer according to claim 2, further comprising a display configured to display information on the parameters outputted from the correlation computing section.

5. The data analyzer according to claim 4, wherein the display displays the correlation value between the parameters and the mapped images.

6. The data analyzer according to claim 1, further comprising a filtering section configured to perform digital image filtering on the mapped images generated by the image generator.

7. The data analyzer according to claim 1, wherein the exposure apparatus performs scanning exposure, and the predetermined area is an area where the exposure apparatus performs a single action of the scanning exposure.

8. The data analyzer according to claim 1, further comprising a controller configured to change a parameter relating to control of at least one apparatus out of the plurality of apparatuses based on the correlation value between the parameters.

9. The data analyzer according to claim 8, wherein the controller changes a parameter relating to control of the at least one apparatus based on a result of inspection of the wafer performed by the wafer inspection apparatus.

10. The data analyzer according to claim 1, wherein the correlation computing section determines a correlation value between parameters of different apparatuses out of the plurality of apparatuses.

11. The data analyzer according to claim 1, wherein the correlation computing section determines a correlation value between parameters in a single apparatus out of the plurality of apparatuses.

12. The data analyzer according to claim 1, wherein the light source apparatus is a laser apparatus.

13. The data analyzer according to claim 12, wherein the data that the data collector acquires from the laser apparatus includes
data on a beam characteristic of the pulsed light,
data on pulse energy of the pulsed light, and
data on a spectrum of the pulsed light.

14. The data analyzer according to claim 1, wherein the data that the data collector acquires from the exposure apparatus includes
data on an exposure condition.

15. The data analyzer according to claim 1, wherein the data that the data collector acquires from the wafer inspection apparatus includes
data on a shape of the wafer, and
data on a defect of the wafer.

16. A semiconductor manufacturing system comprising:
a plurality of apparatuses including a light source apparatus, an exposure apparatus configured to expose a wafer to pulsed light outputted from the light source apparatus, and a wafer inspection apparatus configured to inspect the wafer exposed by the exposure apparatus;
a data collector configured to acquire data on each analysis target parameter of each of the plurality of apparatuses from the apparatus;
an image generator configured to visualize the data on each of the plurality of parameters collected by the data collector from the plurality of apparatuses that process the wafer for each predetermined area of the wafer to convert the data into an image and generate a plurality of mapped images for each of the parameters of the plurality of apparatuses;
a correlation computing section configured to perform pattern matching on arbitrary mapped images out of the plurality of mapped images generated from the wafer to determine a correlation value between arbitrary parameters out of the plurality of parameters of the plurality of apparatuses; and
a controller configured to change a parameter relating to control of at least one apparatus out of the plurality of apparatuses based on the correlation value between the parameters, wherein
the image generator is configured to generate a mapped image in which differences in data are expressed in grayscales, and
the image generator sets a target value of each of the parameters to be a median of the grayscales.

17. A data analysis method comprising:
acquiring data on each analysis target parameter of each of a plurality of apparatuses from the apparatus, the plurality of apparatuses including a light source apparatus, an exposure apparatus configured to expose a wafer to pulsed light outputted from the light source apparatus, and a wafer inspection apparatus configured to inspect the wafer exposed by the exposure apparatus;
visualizing the data on each of the plurality of parameters acquired from the plurality of apparatuses that process the wafer for each predetermined area of the wafer to convert the data into an image and generating a plurality of mapped images for each of the parameters of the plurality of apparatuses;
performing pattern matching on arbitrary mapped images out of the plurality of mapped images generated from the wafer to determine a correlation value between arbitrary parameters out of the plurality of parameters of the plurality of apparatuses,
generating a mapped image in which differences in data are expressed in grayscales, and
setting a target value of each of the parameters to be a median of the grayscales.

18. A semiconductor manufacturing method comprising:
acquiring data on each analysis target parameter of each of a plurality of apparatuses from the apparatus, the plurality of apparatuses including a light source apparatus, an exposure apparatus configured to expose a wafer to pulsed light outputted from the light source apparatus, and a wafer inspection apparatus configured to inspect the wafer exposed by the exposure apparatus;
visualizing the data on each of the plurality of parameters acquired from the plurality of apparatuses that process the wafer for each predetermined area of the wafer to convert the data into an image and generating a plurality of mapped images for each of the parameters of the plurality of apparatuses;
performing pattern matching on arbitrary mapped images out of the plurality of mapped images generated from the wafer to determine a correlation value between arbitrary parameters out of the plurality of parameters of the plurality of apparatuses;

changing a parameter relating to control of at least one apparatus out of the plurality of apparatuses based on the correlation value between the parameters, generating a mapped image in which differences in data are expressed in grayscales, and setting a target value of each of the parameters to be a median of the grayscales.

* * * * *